(12) United States Patent
Sakaguchi

(10) Patent No.: US 11,714,106 B2
(45) Date of Patent: Aug. 1, 2023

(54) TEST APPARATUS, TEST METHOD AND RECORDING MEDIUM

(71) Applicant: RENESAS ELECTRONICS CORPORATION, Tokyo (JP)

(72) Inventor: Kazuhiro Sakaguchi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 54 days.

(21) Appl. No.: 17/553,226

(22) Filed: Dec. 16, 2021

(65) Prior Publication Data
US 2022/0268809 A1 Aug. 25, 2022

(30) Foreign Application Priority Data
Feb. 25, 2021 (JP) .................. 2021-028045

(51) Int. Cl.
*G01R 1/02* (2006.01)
*G01R 1/04* (2006.01)
*G01R 1/067* (2006.01)
*G01R 1/073* (2006.01)
*G01R 31/00* (2006.01)
*G01R 31/28* (2006.01)

(52) U.S. Cl.
CPC .................. *G01R 1/07342* (2013.01)

(58) Field of Classification Search
CPC . G01R 1/02; G01R 1/04; G01R 1/067; G01R 1/073; G01R 31/00; G01R 31/02; G01R 31/28
See application file for complete search history.

(56) References Cited

U.S. PATENT DOCUMENTS

2015/0362552 A1* 12/2015 Ozawa ............... G01R 1/07307
324/750.23

FOREIGN PATENT DOCUMENTS

JP 2007-335785 A 12/2007

* cited by examiner

*Primary Examiner* — Neel D Shah
(74) *Attorney, Agent, or Firm* — McDermott Will & Emery LLP

(57) ABSTRACT

Provided is a technique capable of improving test efficiency of semiconductor devices. A test apparatus includes a probe card having a plurality of measurement sites that contact with a plurality of semiconductor devices formed on a semiconductor wafer; a control unit configured to generate map information, probe-card form information, and contact-position information, the map information including position information and peculiar information of the semiconductor devices on the semiconductor wafer, the probe-card form information including arrangement information of the measurement sites, the contact-position information indicating a contact position that is a range of the semiconductor device tested at one time by the probe card based on constrained-condition information of limiting contact with the probe card; and a position control unit configured to control a relative position between the probe card and the semiconductor wafer based on the contact-position information.

12 Claims, 37 Drawing Sheets

FIG. 9

MPI

| X | Y | PF |
|---|---|----|
| 7 | 1 | F |
| 8 | 1 | P |
| 9 | 1 | P |
| 10 | 1 | P |
| 5 | 2 | P |
| 6 | 2 | P |
| 7 | 2 | P |
| 8 | 2 | F |
| 9 | 2 | P |
| ⋮ | ⋮ | ⋮ |

FIG. 19

CMP

|   | X, Y |
|---|------|
| 1 | 8, 1 |
| 2 | 9, 2 |
| 3 | 5, 2 |
| 4 | 4, 3 |
| 5 | 7, 3 |
| 6 | 10, 3 |
| 7 | 12, 3 |

FIG. 29

TEST APPARATUS, TEST METHOD AND RECORDING MEDIUM

CROSS-REFERENCE TO RELATED APPLICATIONS

The present application claims priority from Japanese Patent Application No. 2021-028045 filed on Feb. 25, 2021, the content of which is hereby incorporated by reference to this application.

BACKGROUND

The present disclosure relates to a test apparatus, for example, is applicable to a test apparatus that performs tests of a semiconductor device formed on a semiconductor wafer by a probe card having a plurality of measurement sites.

A plurality of semiconductor devices formed on one semiconductor wafer are individually commercialized. Here, the semiconductor wafer is also simply referred to as a "wafer", and the semiconductor device is also simply referred to as a "device" or a "chip". Therefore, a non-defective product or a defective product is tested in units of not wafer but device. This test is performed by measuring electrical characteristics of each device with a tester. For example, a probe card set in a prober brings a probe needle(s) into contact with each device, and the tester inputs electric power and electrical signals to the device through the prober and measures the output. Consequently, the electrical characteristics of each device are measured.

For example, Japanese Patent Application Laid-Open No. 2007-335785 discloses the followings regarding an inspection apparatus of semiconductor wafers. In this inspection apparatus of the semiconductor wafers, an individual chip formed on the semiconductor wafer is tested by using a tester (s), all the chips formed on the semiconductor wafer are tested, and, as a result, a defect map indicating positions of the chips determined to be defective is generated.

SUMMARY

A plurality of devices formed on a wafer may be tested by using a probe card having a plurality of measurement sites. Which device on the wafer the probe card contacts with is determined in advance based on a forming state (arranging state) of the device on the wafer, an arranging status of the plurality of measurement sites of the probe card, and the like.

For example, even in the test of a device formed on the wafer on which the device determined to be defective as a result of the previous test process exists, the test is performed according to a predetermined contact position. By doing so, the probe card always contacts at the predetermined position, so that the probe card may contact even with the device that has already been determined to be defective and does not need to be tested. Therefore, test efficiency deteriorates from the viewpoint that all the measurement sites of the probe card are not effectively used.

Other problems and novel features will be apparent from the description of the present specification and the accompanying drawings.

An outline of a representative one of the present disclosure will be briefly described as follows.

That is, a test apparatus includes a probe card having a plurality of measurement sites that contact with a plurality of semiconductor devices formed on a semiconductor wafer; a control unit configured to generate map information, probe-card form information, and contact-position information, the map information including position information and peculiar information of the semiconductor devices in the semiconductor wafer, the probe-card form information including arrangement information of the measurement sites, the contact-position information indicating a contact position that is a range of the semiconductor devices tested at one time by the probe card based on constrained-condition information of limiting contact with the probe card; and a position control unit configured to control a relative position between the probe card and the semiconductor wafer based on the contact-position information.

According to the present disclosure, the test efficiency can be improved.

BRIEF DESCRIPTION OF THE DRAWINGS

FIG. 9 is a diagram for explaining an example of map information in the aspect of the first embodiment.

FIG. 19 is a view showing an example of a contact map that indicates information on the contact positions and the contact order illustrated in FIG. 18.

FIG. 29 is a diagram for explaining a determining method of contact positions in an aspect of the fourth embodiment.

DETAILED DESCRIPTION

Figure 1:
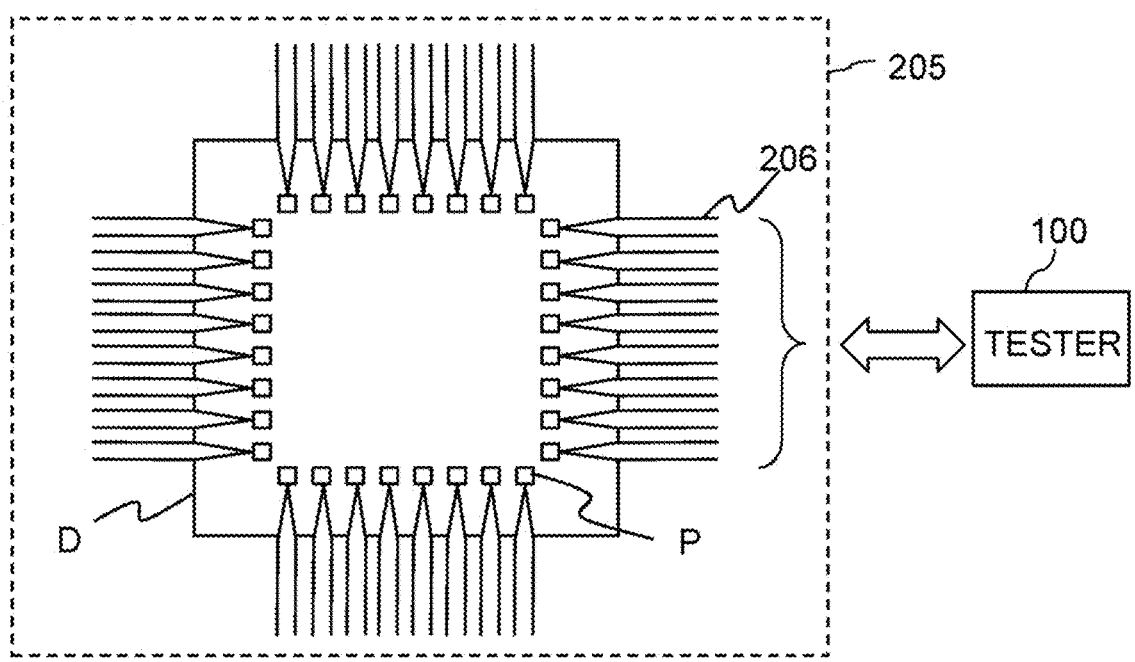
FIG. 1 is a diagram for explaining a test method of a device by a probe card.

Hereinafter, embodiments will be described with reference to the drawings. However, in the following description, the same components may be denoted by the same reference numerals, and a repetitive description thereof may be omitted. Incidentally, in order to further clarify the explanation, the drawings may schematically represent a width, a thickness, a shape, or the like of each part as compared with the actual embodiment, but this is just an example, and the interpretation of the present disclosure is not limited.

Figure 2:
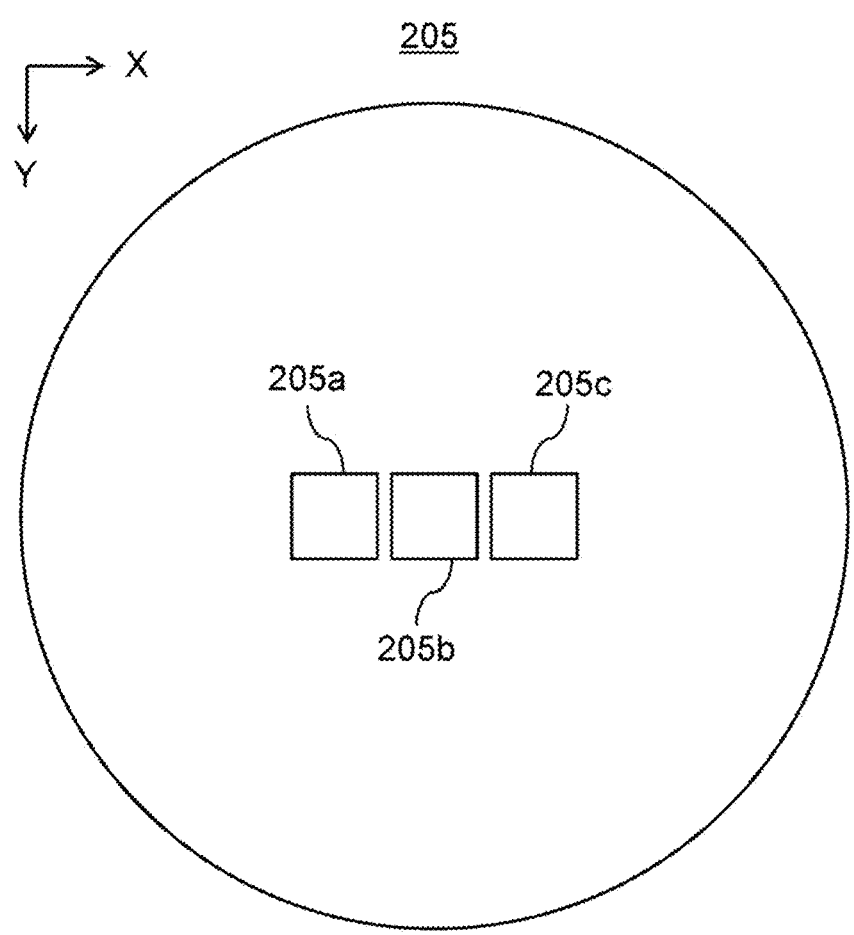
FIG. 2 is view showing the probe card provided with a plurality of measurement sites.

First, in order to further clarify the present embodiments, a problem(s) in testing a plurality of devices formed on a wafer by a probe card having a plurality of measurement sites will be described with reference to FIGS. 1 to 4. This problem has been found by the discloser of the present disclosure after consideration prior to the present disclosure. FIG. 1 is a diagram for explaining a testing method of devices by using a probe card. FIG. 2 is a view showing a probe card provided with a plurality of measurement sites.

Figure 3:
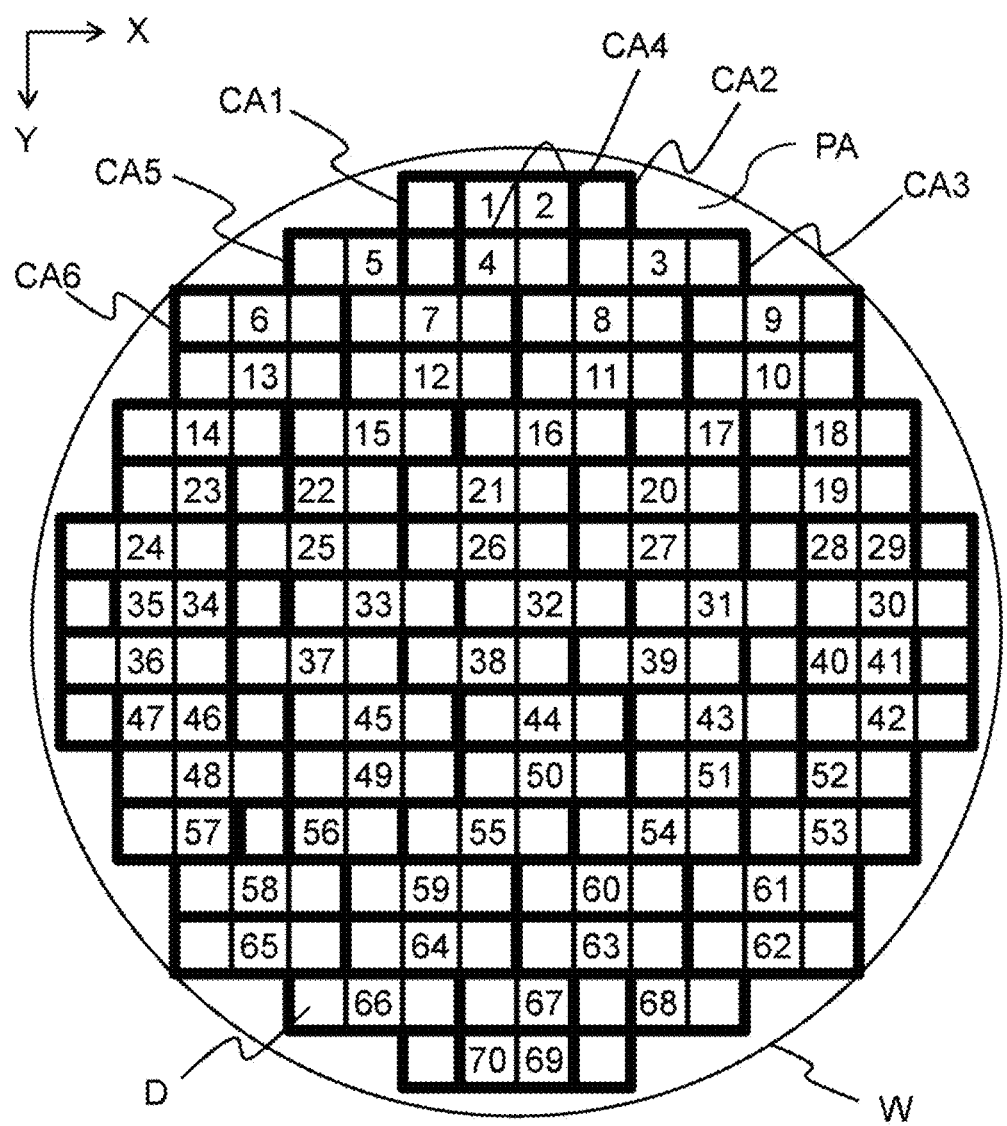
FIG. 3 is a diagram for explaining positions where the probe card shown in FIG. 2 is brought into contact with a device formed on a wafer.

FIG. 3 is a diagram explaining positions where the probe card shown in FIG. 2 is brought into contact with devices formed on a wafer.

Figure 4:
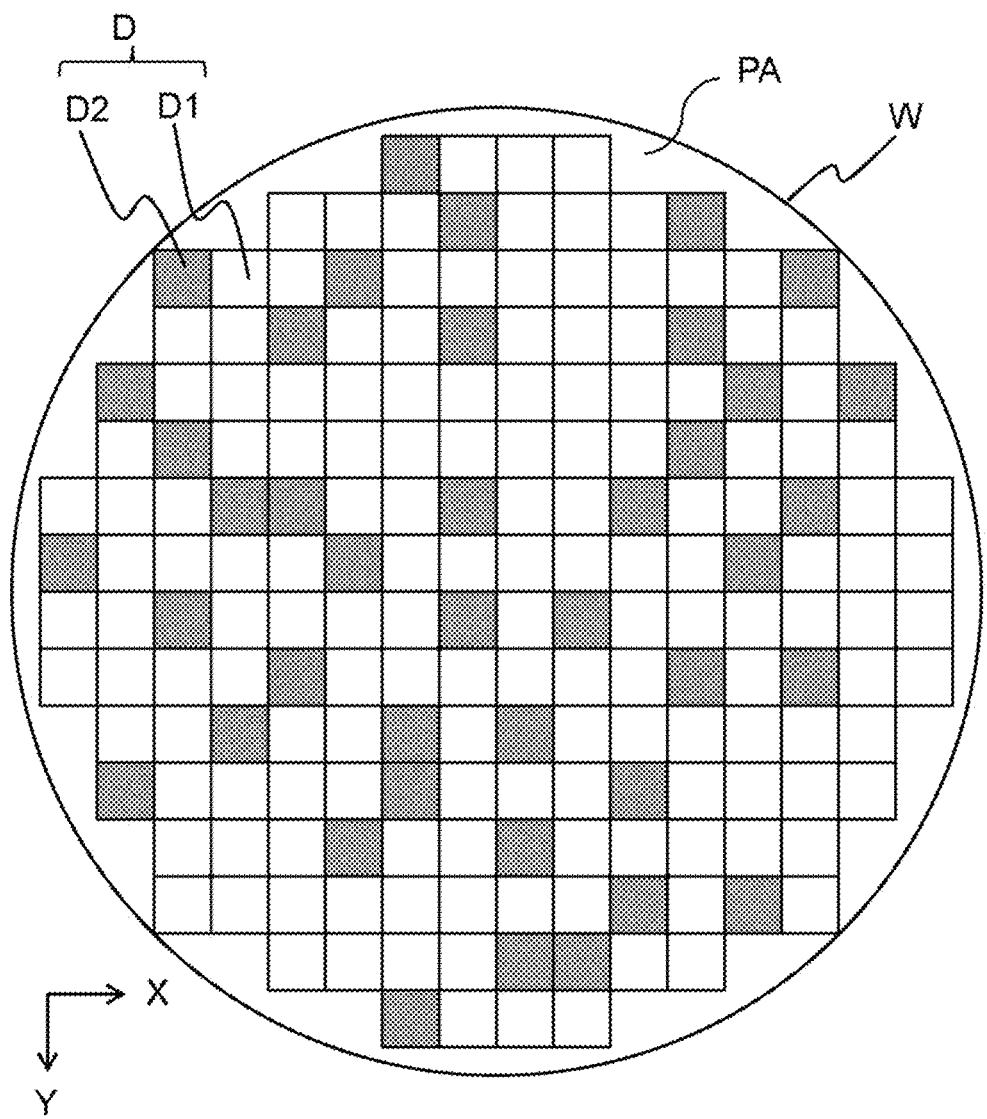
FIG. 4 is view showing an example in which a defective product(s) is included in the devices formed on the wafer illustrated in FIG. 3.

FIG. 4 is a view showing an example in which a defective product(s) is included in the devices formed on the wafer illustrated in FIG. 3

As shown in FIG. 1, a probe card 205 has a plurality of needle-shaped probes 206, and one end of the probe 206 is brought into contact with a pad P provided on a device D and is electrically connected to the device D. This makes it possible to measure and test the device D by supplying electric power and an electrical signal(s) from a tester 100 to the device D and measuring the device. The probe 206 may contact with a bump provided on the device D.

As shown in FIG. 2, for example, three measurement sites 205a to 205c may be provided alongside on one probe card 205 along an X-axis direction. Each of the measurement sites 205a to 205c has the plurality of probes 206 as shown in FIG. 1. This makes it is possible to test three devices at one time, and to reduce time required for testing per wafer as compared with a case of testing of one device at one time.

As shown in FIG. 3, a large number of devices D are formed in a tile shape on the wafer W, and are arranged along the X-axis direction and a Y-axis direction. Here, the device D is displayed as a small rectangle. When these devices D are tested by using the probe card 205 shown in FIG. 2, three devices D that are continuous in a lateral direction (X-axis direction) on the wafer W can be tested at one time. In FIG. 3, the contact position as a range of the devices D to be tested at one time in FIG. 3 is illustrated by a thick black rectangle, and three devices D are included in one rectangle. A numerical value written in the rectangle indicates order in which the probe card 205 contacts with the devices D on the wafer W. In FIG. 3, numbers 1 to 70 are assigned as contact positions, and the probe card 205 is caused to contact with the devices D at seventy times in total, thereby testing all the devices D formed on the wafer W. Reference numerals CA1 to CA6 indicate first to sixth contact positions. Incidentally, there are some partially overlapping regions of the rectangles like the first contact position CA1 and second contact position CA2, and the fourth contact position CA4 and fifth contact position CA5. This is because the contact position of the probe card 205 is adjusted so that the measurement sites 205a to 205c of the probe card 205 do not contact with a device non-forming region PA serving as a region where the device D is not formed on an outer circumference of the wafer W. Here, the device non-forming region PA is a region where the device D on the outer circumference of the wafer W is not formed.

The contact position and contact order of the probe card 205 with respect to the device D on the wafer W are generally adjusted so as to minimize the total testing time and so that all the devices D on the wafer W are tested with the minimum number of times of contact. A contact map CMP is determined based on a forming state of the devices D on the wafer W, an arranging status of the plurality of measurement sites 205a to 205c of the probe card 205, and the like. The contact map CMP is information indicating which device D on the wafer W the probe card 205 contacts with and in what order the probe card contact with the device. This contact map CMP is predetermined for each type of devices on the wafer W and for each type of probe cards. According to this contact map CMP, a prober 200 operates so that the probe card 205 contacts with the designated device D on the wafer W in designated order, thereby being able to test the device D. The forming state of the devices on the wafer W is arrangement of the devices on the wafer W, and differs depending on a type (size) of the device, but is the same as that of the devices of the same type. The devices of the same type have at least the same size and same pad arrangement. The wafers in which the same type of device is placed at the same position are the same type of wafer.

The device on the wafer is usually tested at a plurality of times by changing a test condition such as temperature and test contents. For example, the tests may be performed under room-temperature conditions and then at high-temperature conditions. Each test is called a room-temperature test process and a high-temperature test process. As shown in FIG. 4, even in being tested in the subsequent high-temperature test process of the device D formed on the wafer in which the device determined to be defective exists from a testing result in the previous room-temperature test process, the test is performed according to the predetermined contact map. Here, a vacant device indicates a non-defective device D1 and a device as an object to be tested (test targeted device). A gray device is a defective device D2 and is a device that does not need to be tested (test non-targeted device). Even if the wafers are of the same type, the arrangements of the non-defective device D1 and the defective device D2 differ depending on the wafer. The predetermined contact map is, for example, the contact map used in the previous test process, and is information on contact with the contact positions shown in FIG. 3 in order shown in FIG. 3.

However, when the test is performed according to the predetermined contact map, the probe card 205 always contacts with the predetermined position, so that the probe card 205 also contacts with the defective device D2 which has already been determined to be defective. In this case, the defective device D2 is not actually tested, but if the device connected to another measurement site is a non-defective device D1, it takes a constant test time to test the non-defective device D1. That is, when the non-defective device D1 is present even in one of the devices with which the plurality of measurement sites 205a to 205c contact, the testing is performed to the non-defective device D1 for the constant test time. During that time, any of the measurement sites 205a to 205c of the probe card 205 also contacts with the defective device D2. Therefore, the test efficiency deteriorates from the viewpoint that all the measurement sites 205a to 205c of the probe card 205 are not effectively used. This deterioration in test efficiency results in a long test time required to test all the non-defective devices D1 formed on the wafer W.

Next, an outline of the present embodiment will be described. A test apparatus according to the embodiment appropriately determines the contact positions of the probe card with respect to the devices based on position information of the test non-targeted devices defined for each wafer in the wafer. This makes it possible to reduce the number of times of contact of the probe card with the test non-targeted devices, and improving the measurement efficiency makes it possible to shorten the test time required for one wafer.

Further, the test apparatus according to the embodiment appropriately adjusts the contact position of the probe card with respect to the device formed on the wafer based on a constrained condition determined for each individual device. This makes it possible to improve test quality. In addition, the test apparatus according to the embodiment appropriately sets the contact order of the probe card with respect to the devices formed on the wafer. This makes it possible to stabilize the test quality for the device.

Several representative examples of the above-mentioned test apparatus according to the embodiment will be exemplified below.

First Embodiment

Figure 5:
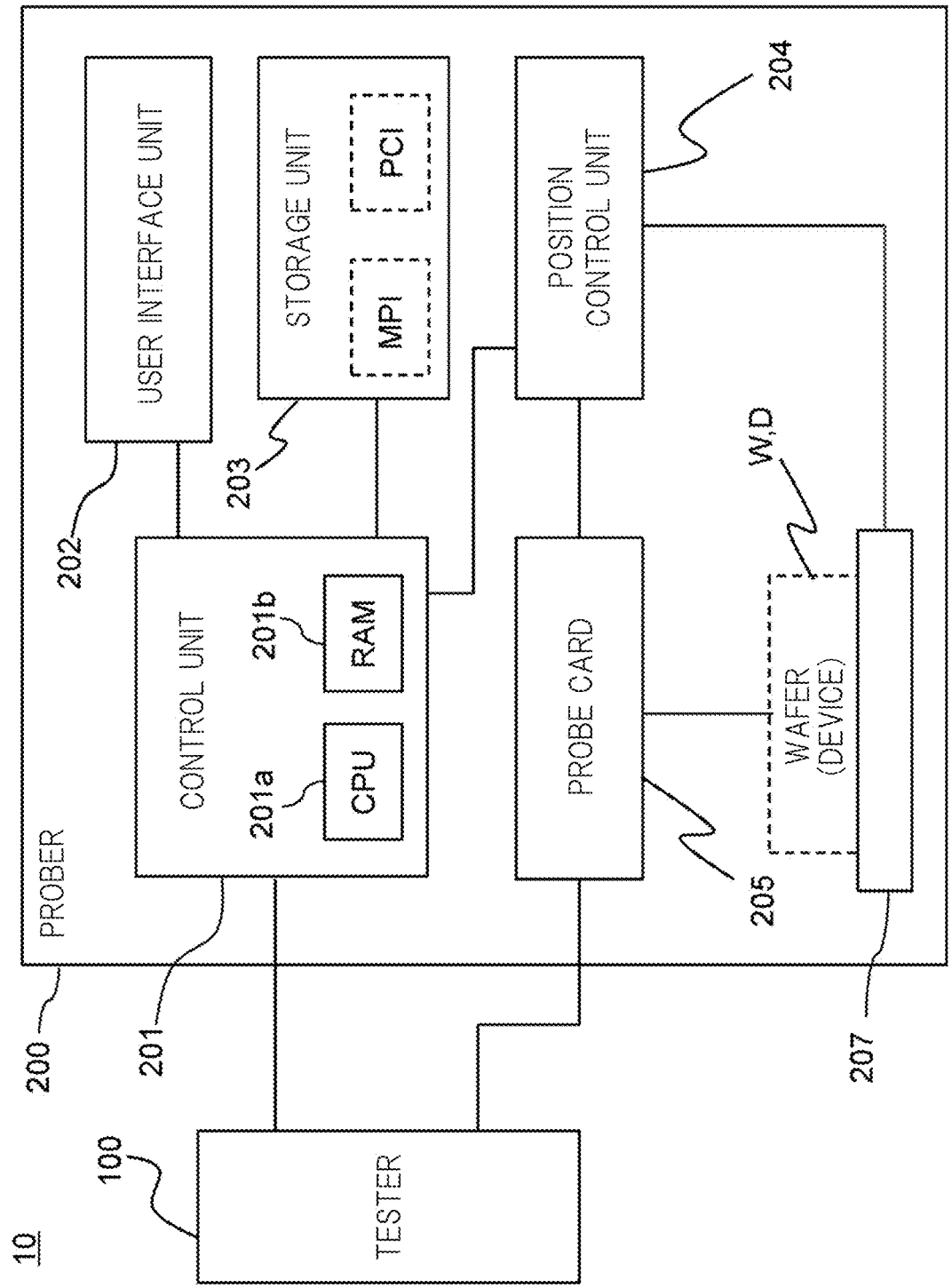
FIG. 5 is a block diagram showing a configuration of a test apparatus according to a first embodiment.

A configuration of a test apparatus according to a first embodiment will be described with reference to FIG. 5. FIG. 5 is a block diagram showing a configuration of a test apparatus according to a first embodiment.

A test apparatus 10 according to a first embodiment includes a tester 100 and a prober 200. A device D to be tested formed on a wafer W is connected to the prober 200, and a probe card 205 is connected to a device D designated on the wafer W by the prober 200. The tester 100 is connected to the prober 200, supplies a power source to the device D via the prober 200, and applies a test signal. Further, the tester 100 reads a response of the device D to an application of the test signal, and inspects the device D by collating it with designated test conditions.

The prober 200 has a control unit 201, a user interface unit 202, a storage unit 203, a position control unit 204, a probe card 205, and a stage 207. The storage unit 203 is connected to the control unit 201. The storage unit 203 is composed of, for example, a flash memory, an HDD (Hard Disk Drive), an SSD (Solid State Drive Solid), or the like. The storage unit 203 holds a control program(s) for controlling the prober 200, a control parameter(s), map information described later, probe-card form information, and the like. The control unit 201 includes a CPU (Central Processing Unit) 201a, a RAM (Random Access Memory) 201b, and the like. The control unit 201 reads the control program from the storage unit 203 into the RAM 201b, and the CPU 201a controls an operation of the prober 200 by executing the program. The user interface unit 202 is connected to the control unit 201 to output and input information from and to an outside of the prober 200.

For example, a program or the like is provided to the storage unit 203 from an external storage unit. The storage unit 203 and the external storage unit are configured as computer-readable recording media. Hereinafter, these are collectively referred to simply as a recording medium. When the term "recording medium" is used in the present specification, it may include only the storage unit 203 alone, only the external storage unit alone, or both of them. Incidentally, the program may be provided to the storage unit 203 by using a communication means such as the Internet or a dedicated line without using the external storage unit.

The position control unit 204 moves the stage 207 based on the position information of the device D on the wafer W, which is transmitted from the control unit 201, to adjust the positions of the probe card 205 and the device D on the wafer W. Then, the position control unit 204 electrically connects the probe card 205 to the designated device D. The stage 207 attracts and fixes the mounted wafer W, and can move in a horizontal direction (XY direction) and a vertical direction based on an instruction from the position control unit 204. The position control unit 204 is configured by a CPU, a microcontroller including a memory, and the like.

Figure 6:
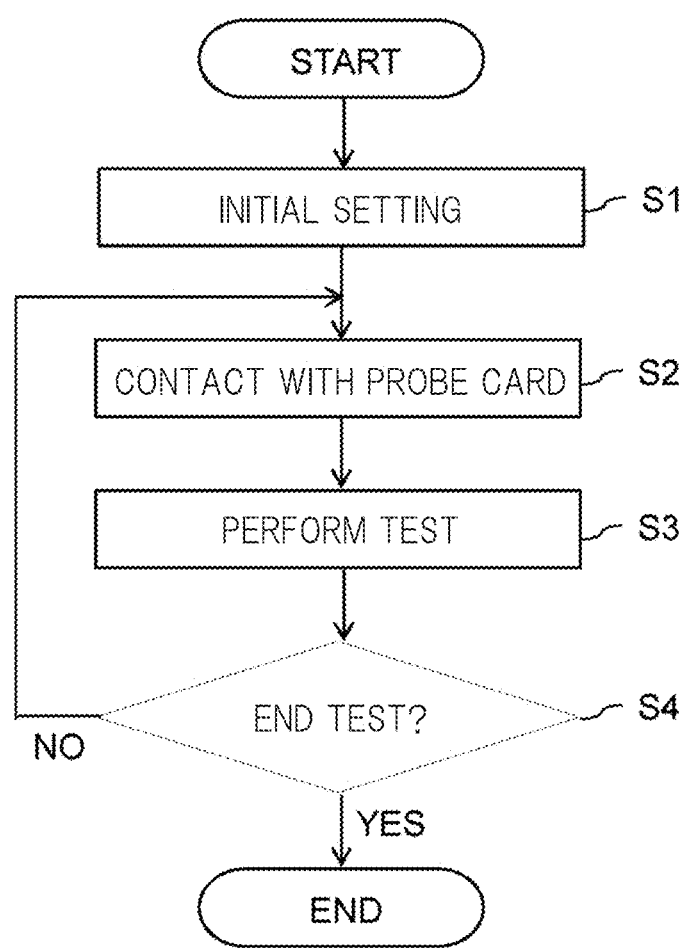
FIG. 6 is a flowchart for explaining an operation of the test apparatus shown in FIG. 5.

Next, an operation of the test apparatus according to the present embodiment will be described with reference to FIG. 6. FIG. 6 is a flowchart showing an operation of the test apparatus illustrated in FIG. 5.

(Initial Setting: Step S1)

In testing the device D by using the prober 200, the test is usually performed in units of wafer. First, prior to the test, initial setting is performed to the prober 200. This initial setting includes making a contact map CMP for the devices D by the control unit 201.

(Contact of Probe Card: Step S2)

After the initial setting is completed, the test for the device D is started according to the contact map CMP. First, the control unit 201 transmits a contact position of the probe card 205 to the position control unit 204 with reference to the contact map CMP. According to this, the position control unit 204 moves the stage 207 to adjust the probe card 205 to a position (designated position) where the probe card 205 can contact with the designated device D, and establishes an electrical connection between the probe card 205 and the device D.

(Test Performance: Step S3)

After the electrical connection is completed, the position control unit 204 reports the completion to the control unit 201, and the control unit 201 issues a test starting command to the tester 100 in response to the report. The tester 100 performs a test (s) of the device D by the test starting command. In the test, the tester 100 generates a power source and a test signal for the device D, and applies the power source and the test signal to the device D via the probe card 205 in the prober 200. A response of the device D is returned to the tester 100 via the probe card 205, and the tester 100 performs the test of the device D by comparison with a predetermined standard value. After the test is completed, the tester 100 transmits a test result to the control unit 201.

(Test Ending Judgment: Step S4)

The control unit 201 determines whether the tests for all the contact positions designated in the contact map have been completed. If not, the control unit 201 transmits the next contact position to the position control unit 204 and performs the test for the device D similarly to steps S2 and S3 described above. If the probe card 205 contacts with all the designated contact positions and the tests for all the test targeted devices are completed, a series of processes is completed.

Figure 7:
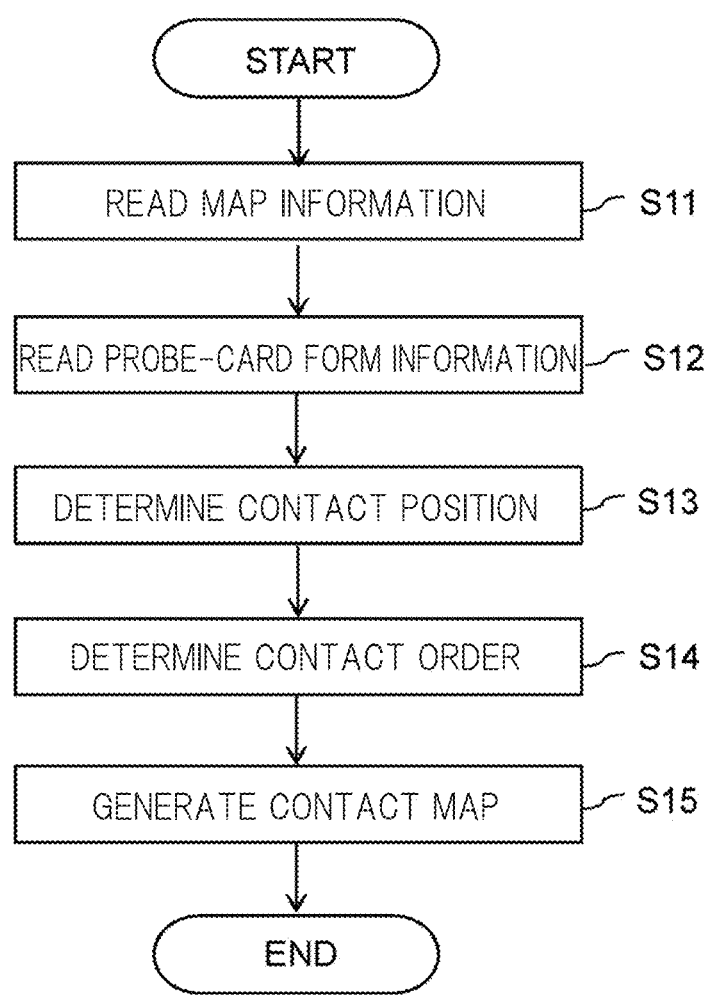
FIG. 7 is a flowchart for explaining an operation of making a contact map.

An operation of making the contact map CMP will be described with reference to FIG. 7. FIG. 7 is a flowchart showing an operation of making the contact map.

(Reading of Map Information: Step S11)

The control unit 201 reads map information MPI of the devices D via the user interface unit 202, or reads the map information MPI stored in the storage unit 203. The map information MPI includes individual pieces of information (peculiar information) of the device D such as position information of each device D in the wafer W and non-defective/defective product information. Test necessity/unnecessity information may be used instead of the non-defective/defective product information. The non-defective/defective product information and the test necessity/unnecessity information are information on the test targeted device or a test non-targeted device.

(Reading of Probe-Card Form Information: Step S12)

The control unit 201 reads probe-card form information PCI via the user interface unit 202, or reads the probe-card form information PCI stored in the storage unit 203. The probe-card form information PCI includes arrangement information of the measurement sites installed in the probe card 205, for example, having three measurement sites 205*a* to 205*c* in a row in a lateral direction; and the like.

(Determination of Contact Position: Step S13)

In testing the device D, the control unit 201 determines the optimum contact position of the probe card 205 with respect to the device D based on the obtained map information MPI and probe-card form information PCI. The optimum contact position is a position of contacting with all the test targeted devices and is a contact position where the total number of times of contact per wafer is minimized. In this case, given in advance is a constrained condition such as whether all the measurement sites 205*a* to 205*c* of the probe card 205 must contact with the device D or whether they are allowed not to contact with the device D. To allow the probe card not to contact with the device D means to allow the probe card to contact with a device non-forming region PA. Furthermore, if the allowance is made, the constrained condition includes an item of how many measurement sites are allowed; or the like.

(Determination of Contact Order: Step S14)

The control unit 201 determines contact-order information indicating in what order the probe card 205 contacts with each contact position based on contact-position information determined in step S13.

(Generation of Contact Map: Step S15)

The control unit 201 generates a contact map CMP based on the contact-position information determined in step S13 and the contact-order information determined in step S14. The contact map CMP includes the contact-position information and the contact-order information of the probe card 205 with respect to the device D on the wafer W, and is information indicating which device D on the wafer W the probe card 205 contacts with and in what order the probe card 205 contacts with the device D.

Figure 8:
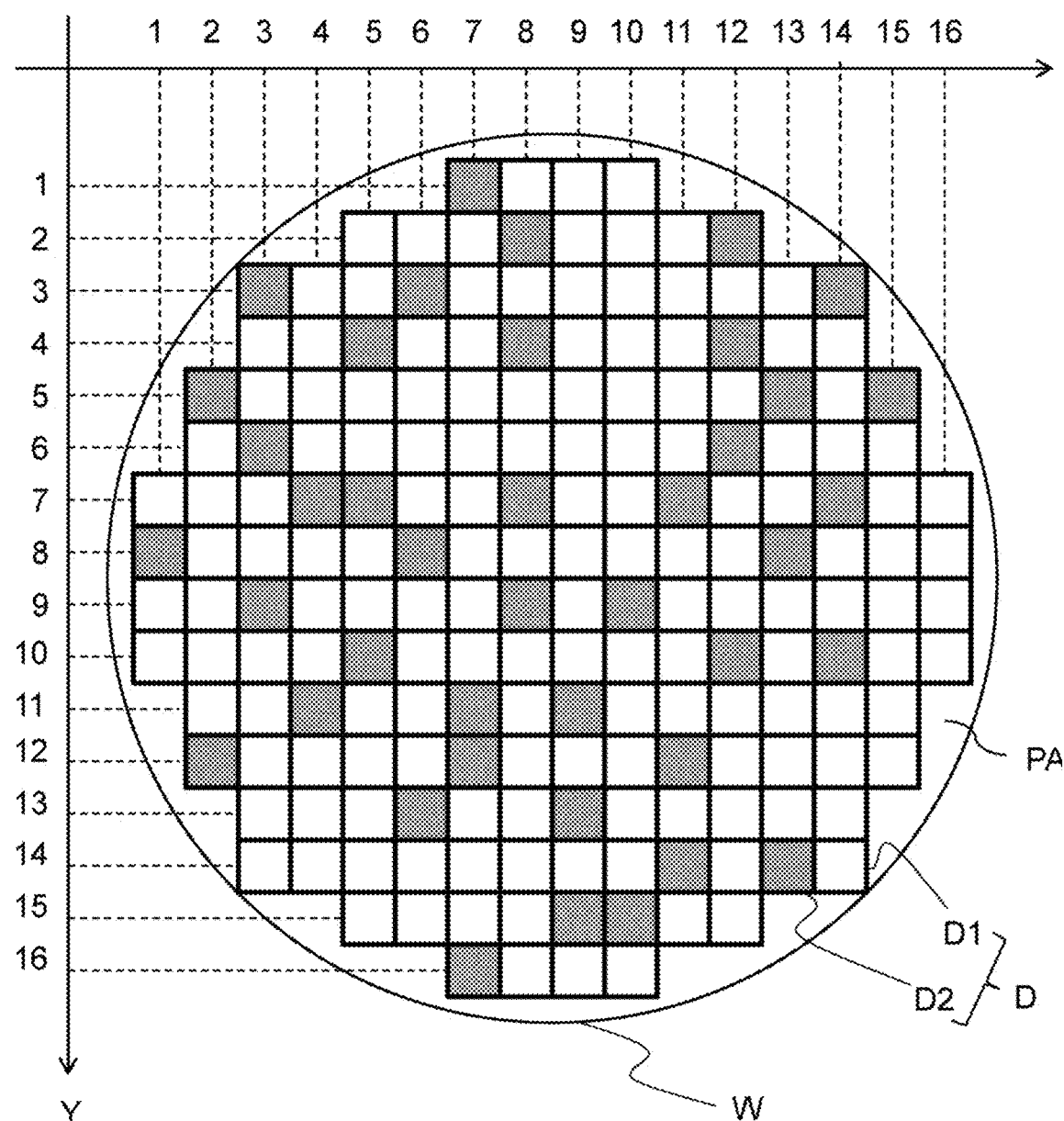
FIG. 8 is a view showing a forming state of devices formed on a wafer in an aspect of the first embodiment.

Next, an aspect in the first embodiment will be described. FIG. 8 is a view showing a forming state of devices formed on a wafer in an aspect of the first embodiment.

On the wafer W shown in FIG. 8, 192 devices D respectively represented by rectangles are formed in a tile shape along an X-axis direction and a Y-axis direction. Incidentally, the vacant device D among the devices D is a device (non-defective device D1) that has been determined to be a non-defective product in the previous test process, and is a test targeted device in this test. Meanwhile, the device illustrated in gray is a device (defective device D2) that has been determined to be defective in the previous test process, and is a test non-targeted device in this test.

In FIG. 8, the X axis and the Y axis are provided to indicate the positions of the devices D in the wafer. Numerical values from 1 to 16 are assigned on the X axis. Similarly, numerical values from 1 to 16 are assigned on the Y axis. Consequently, the position of each device D on the wafer W can be specified by the numerical value on the X axis and the numerical value on the Y axis. For example, the non-defective device D1 has an X-axis value of 14 and a Y-axis value of 14. Further, the position of the defective device D2 has an X-axis value of 13 and a Y-axis value of 14. These are referred to as a device at a position of (X=14, Y=14) and a device at a position of (X=13, Y=14), respectively.

Figure 9:
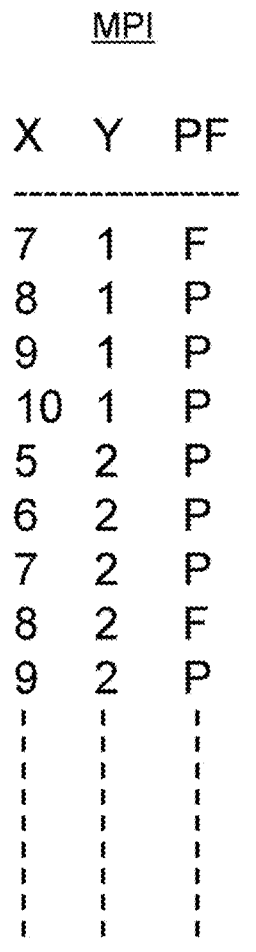

Next, the map information will be described with reference to FIGS. 8 and 9. FIG. 9 is a diagram for explaining an example of map information in an aspect of the first embodiment.

In the wafer W shown in FIG. 8, a device at a position (X=7, Y=1) is a defective device D2, and devices at positions of (X=8, Y=1), (X=9, Y=1), and (X=10, Y=1) are all non-defective devices D1. Therefore, the map information MPI about the devices formed on the wafer W shown in FIG. 8 includes information of one device in each row as shown in FIG. 9, and a breakdown thereof is position information (X-axis and Y-axis values) of the devices, and information on whether the device is a non-defective product (P) or a defective product (F).

Figure 10:
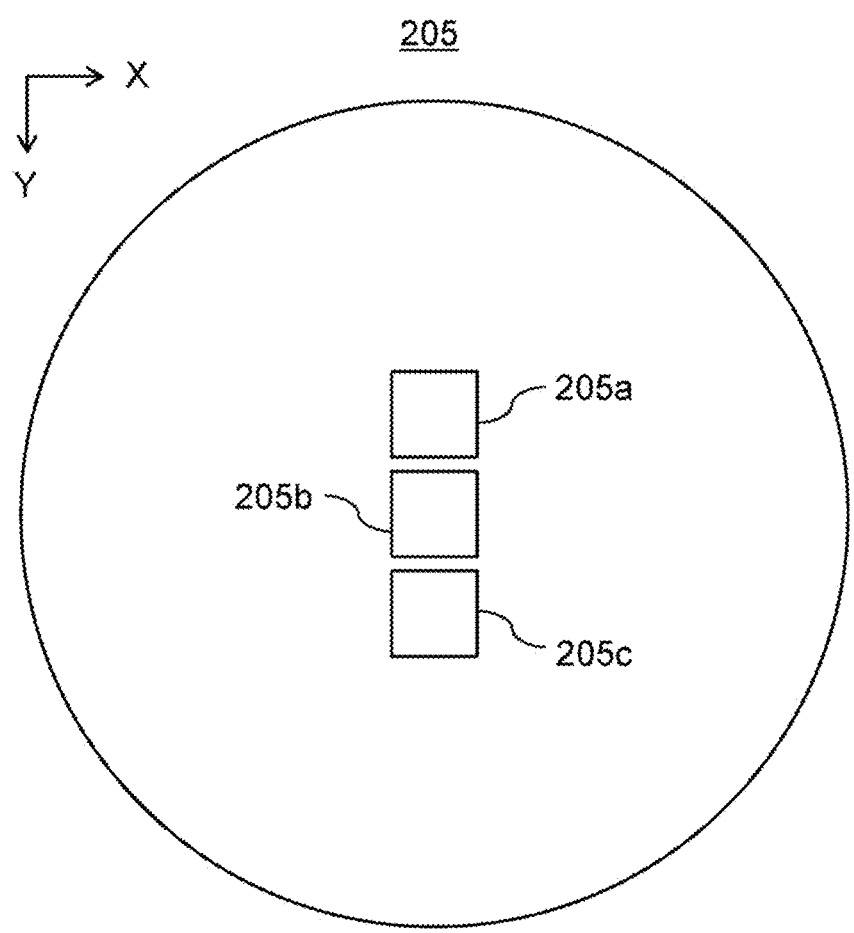
FIG. 10 is a schematic diagram showing a probe card of a second embodiment.
Figure 11:
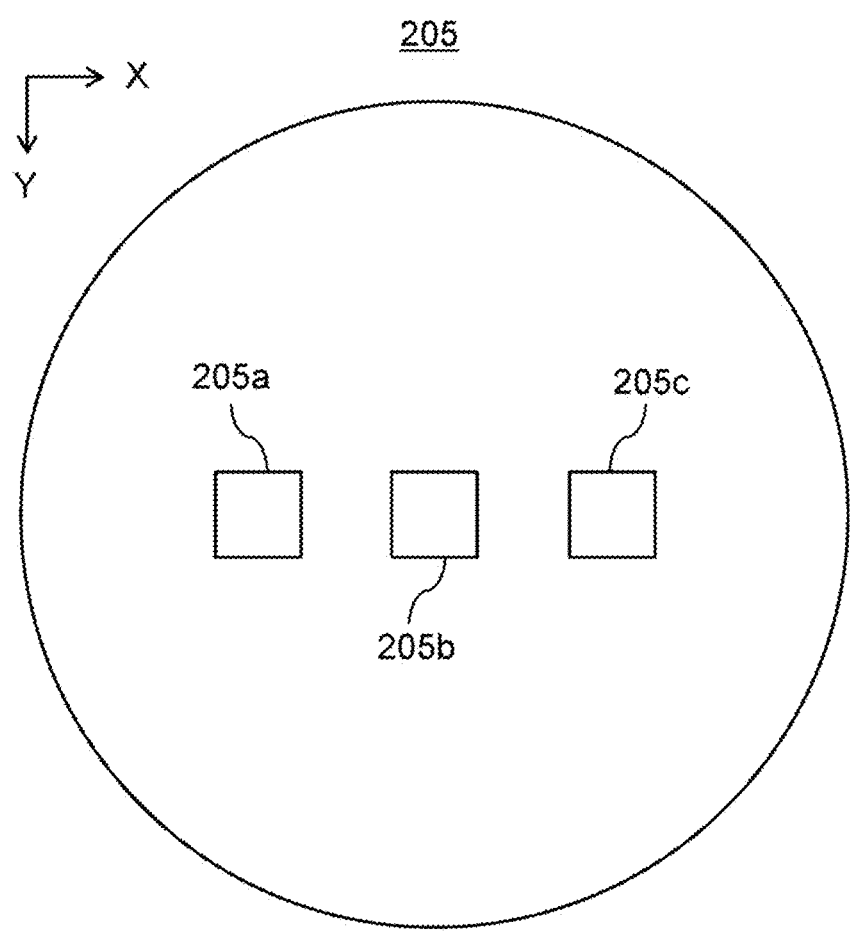
FIG. 11 is a schematic diagram showing a probe card of a third embodiment.
Figure 35:
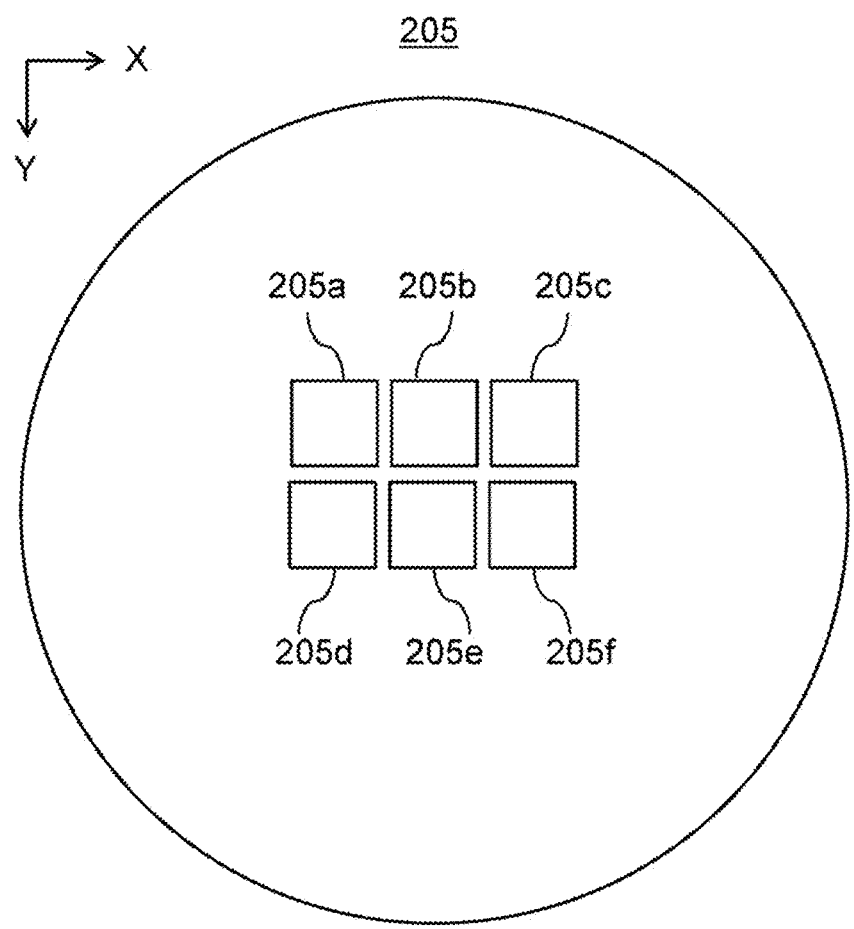
FIG. 35 is a schematic diagram showing a probe card of the fourth embodiment.

The form of the probe card 205 will be described with reference to FIGS. 2, 10, 11 and 35. FIG. 10 is a schematic view showing a probe card of a second embodiment. FIG. 11 is a schematic view showing a probe card of a third embodiment. FIG. 35 is a schematic view showing a probe card of a fourth embodiment.

As shown in FIG. 2, in the probe card 205 of the first embodiment, a first measurement site 205a, a second measurement site 205b, and a third measurement site 205c are continuously provided in a lateral direction (X-axis direction). Similarly, as shown in FIG. 10, in a probe card 205 of a second embodiment, a first measurement site 205a, a second measurement site 205b, and a third measurement site 205c are continuously provided in a vertical direction (Y-axis direction). As shown in FIG. 11, in a probe card 205 of a third embodiment, a first measurement site 205a, a second measurement site 205b, and a third measurement site 205c are provided every other site in the lateral direction (X-axis direction). As shown in FIG. 35, in a probe card 205 of a fourth embodiment, a first measurement site 205a, a second measurement site 205b, a third measurement site 205c, a fourth measurement site 205d, a fifth measurement site 205e, and a sixth measurement site 205f are provided in three columns in the lateral direction (X-axis direction) and two rows in the vertical direction (Y-axis direction). In this way, information indicating how the measurement sites 205a to 205c are provided on the probe card 205 is the form information of the probe card 205.

Next, a method of determining the optimum contact position of a probe card in a first aspect of the first embodiment will be described with reference to FIGS. 12 to 14. Each of FIGS. 12 to 14 is a diagram for explaining a determining method of contact positions of a probe card in a first aspect of the first embodiment.

Figure 12:
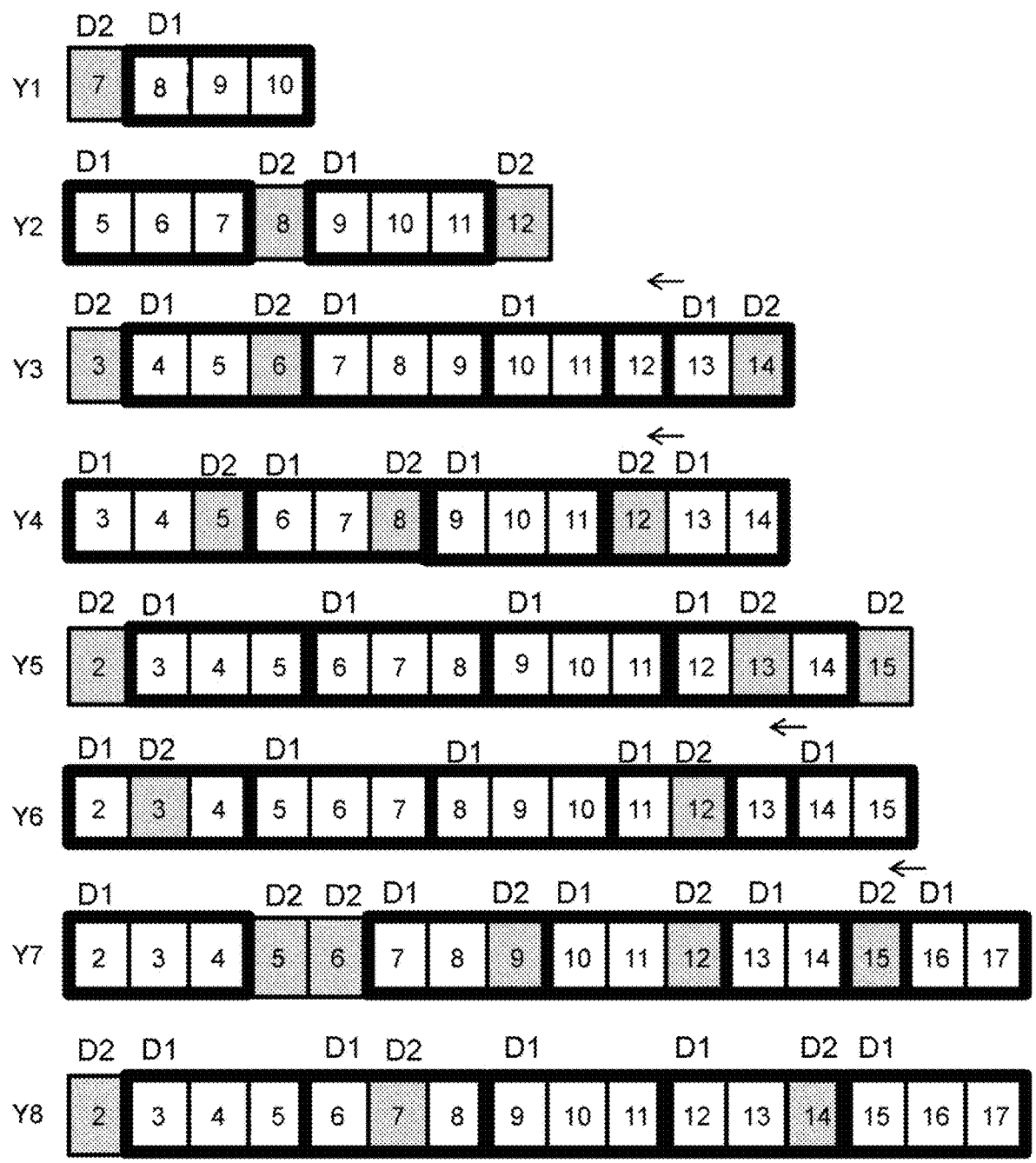
FIG. 12 is a diagram for explaining a determining method of contact positions in a first aspect of the first embodiment.
Figure 13:
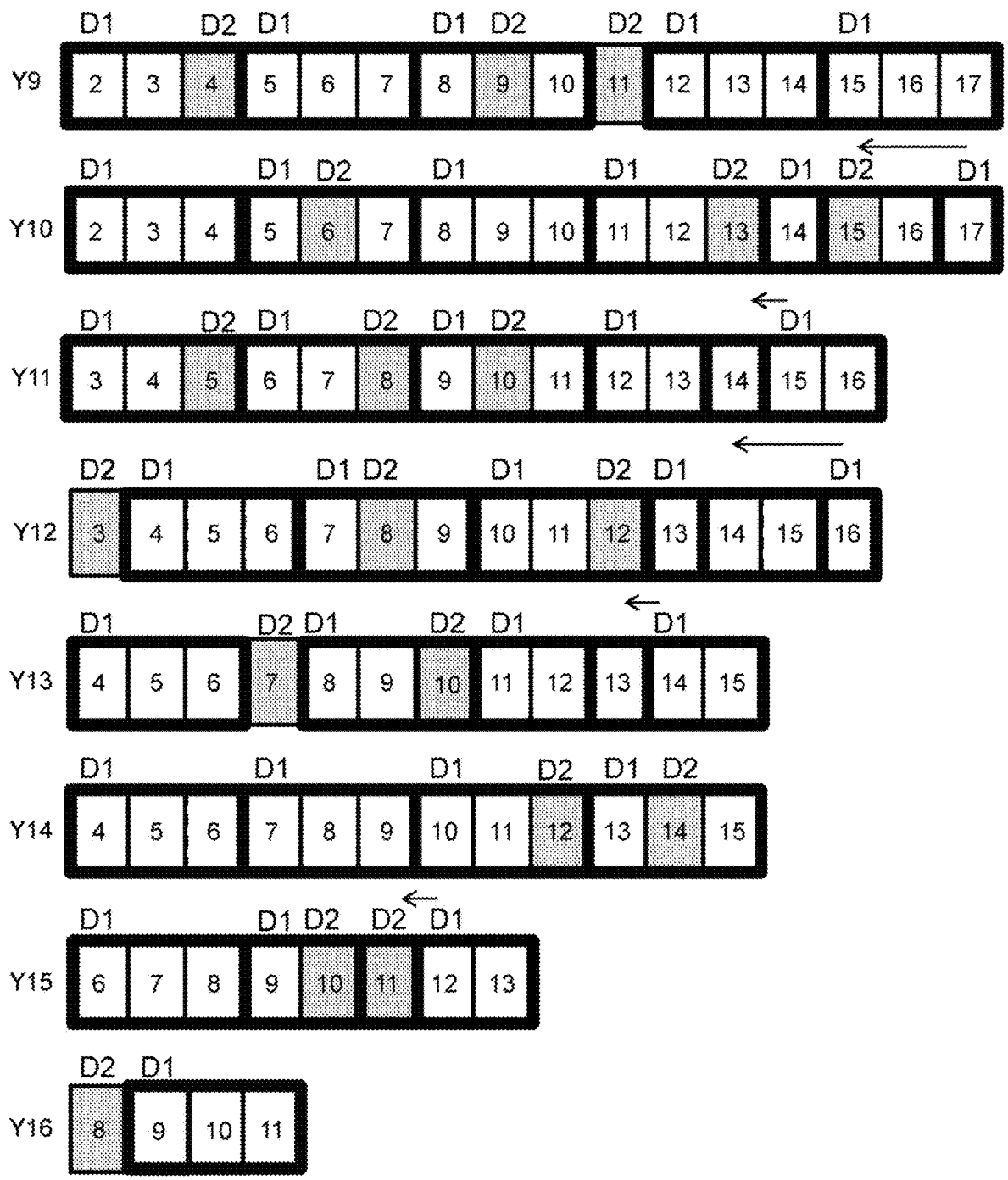
FIG. 13 is a diagram for explaining the determining method of contact positions in the first aspect of the first embodiment.
Figure 14:
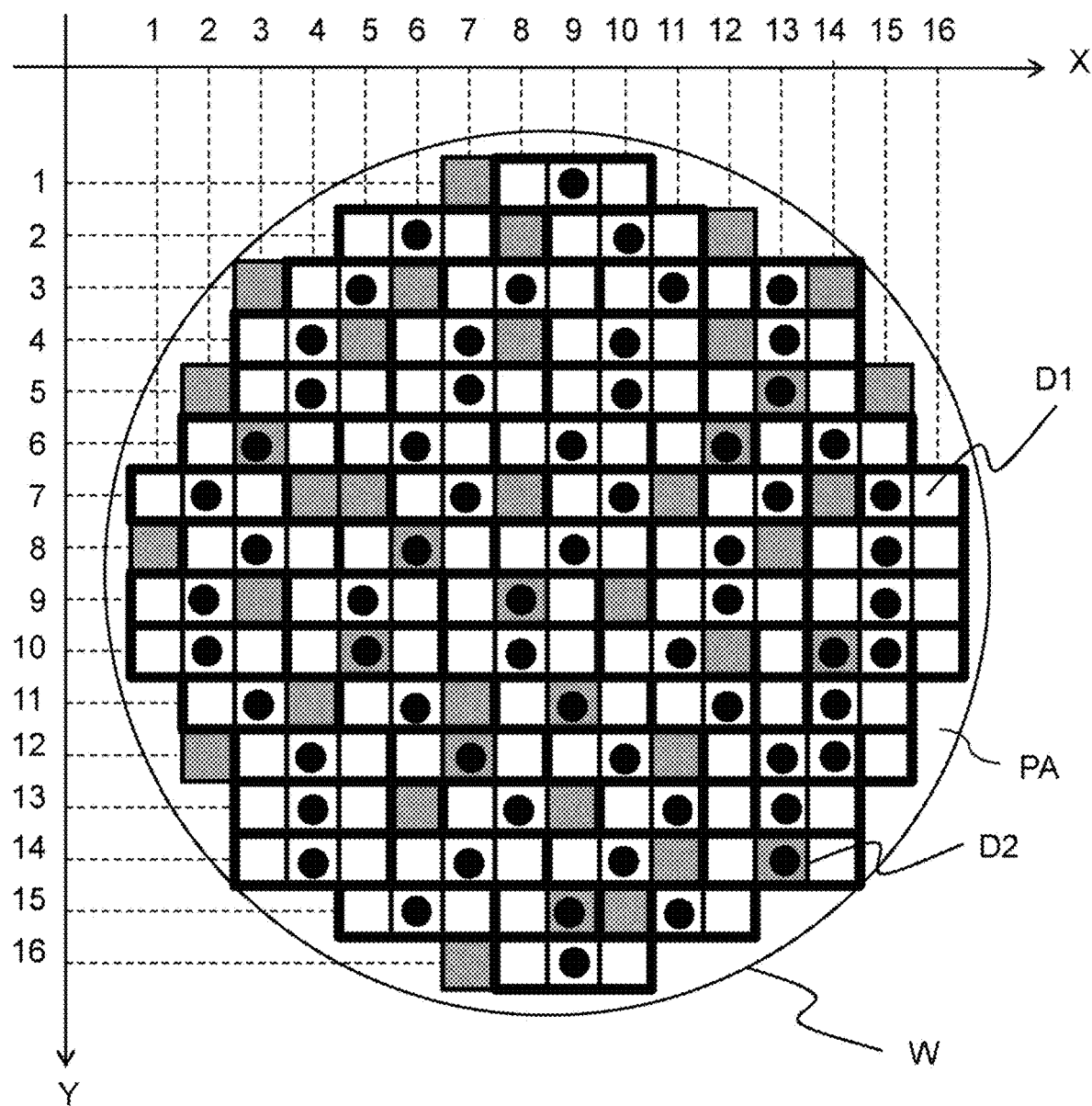
FIG. 14 is a diagram for explaining the determining method of contact positions in the first aspect of the first embodiment.

In FIGS. 12 and 13, the devices on the wafer W shown in FIG. 8 are extracted in the lateral direction (X-axis direction), and the drawings are described as a first row (Y1) and a second row (Y2), etc. from the devices on an upper side of the wafer W. That is, the first row (Y1) means a device having a Y-axis value of 1, and the second row (Y2) means a device having a Y-axis value of 2. Rectangles in the figure respectively represent the devices, and the numerical value described in the rectangle is an X-axis value indicating a position of each device, and is described for identifying each device. The contact positions are determined so that the probe card 205 does not contact with the defective device D2 as much as possible and that any of the measurement sites 205a to 205c of the probe card 205 always contacts with the non-defective device D1. Here, the number of devices arranged in the lateral direction on the wafer W is equal to or greater than the number of measurement sites of the probe card 205.

It is assumed that as the probe card 205 of the first aspect, the probe card 205 of the first embodiment shown in FIG. 2 is used. It is assumed that in the contact of the probe card 205 with the device D, any of the measurement sites 205a to 205c contacts with any device D on the wafer, and contact with the device non-forming region PA is prohibited.

In this aspect, the contact position is determined in principle so that the first measurement site 205a on the leftmost side contacts with the non-defective device D1 on the leftmost side except for the defective device D2 and the device whose contact position has been determined. As a result, the first measurement site may contact with the defective device D2, which is allowed. However, when the measurement sites 205b, 205c are located in the device non-forming region PA, the third measurement site 205c on the rightmost side is returned to a region where the device is formed, and determines the contact position. As a result, the third measurement site may contact with the defective device D2 or the device whose contact position has been determined, which is allowed.

First, the control unit 201 searches for and determines contact positions of the probe card 205 with respect to devices at positions in a first row (Y1) shown in FIG. 12. In searching for each device from the left side, a device at a position of X=7 is a defective device D2, so this device is excluded. Since a device at a position of X=8 subsequently thereto is a non-defective device D1, a position of the probe card 205 is determined so that the first measurement site 205a contacts with the above-mentioned device. By doing so, the second measurement site 205b contacts with a device at a position of X=9 and the third measurement site contacts with a device at a position of X=10. Consequently, a contact position of the probe card 205 is determined, and the three devices at the positions of X=8 to 10 become a target of contacting with the probe card 205 at one time. That is, a rectangular region illustrated by a thick black line among the devices at the positions in the first line (Y1) is the contact position of the probe card 205. This rectangular region includes the devices located at of the positions of X=8 to 10. The device following the device at the position of X=10 is searched, but a non-defective device(s) D1 as a test targeted device is no longer in the first line (Y1), and the search for the contact position in the first line (Y1) is here finished.

Next, the control unit 201 searches for and determines contact positions of the probe card 205 for devices located in a second row (Y2). In searching for each device from the left side, a device at a position of X=5 exists on the leftmost side and is a non-defective device D1, so that a position of the probe card 205 is determined so as for the first measurement site 205a to contact with the device at the position of X=5. Along with this, the second measurement site 205b and the third measurement site 205c also contact with devices at positions of X=6 and 7, respectively. Consequently, the devices at the positions of X=5 to 7 are set as a contact position.

Since a device at a position of X=8 subsequently thereto is a defective device D2, the above-mentioned device is excluded. Since a device at a position of X=9 next thereto is a non-defective device D1, a position of the probe card 205 is determined so that the first measurement site 205a contacts with the device at the position of X=9. Along with this, the second measurement site 205b and the third measurement site 205c contact with devices at positions X=10 and 11, respectively. Consequently, the devices at the positions of X=9 to 11 are set as a contact position.

Since a device at a position of X=12 subsequently thereto is a defective device D2 and no device subsequently thereto exists, the search for contact positions with the devices in the second line (Y2) ends. Consequently, the contact positions with the devices in the second line (Y2) are two rectangular regions illustrated by thick black lines.

Next, the control unit 201 searches for contact positions of the probe card 205 with respect to devices at positions in a third row (Y3). In searching for each device from the left side, a device at a position of X=3 is a defective device D2, so that the above-mentioned device is excluded. Since a device at a position of X=4 next thereto is a non-defective device D1, a position of the probe card 205 is determined so that the first measurement site 205a contacts with the device at the position of X=4. Consequently, the devices at the positions of X=4 to 6 are set as a contact position. Incidentally, the device at the position of X=6 is a defective device D2, but the devices at the positions of X=4 and 5 are the non-defective devices, so that they need to contact with the probe card and the positions of X=4 to 6 are set as the contact position.

Since a device at a position of X=7 subsequently thereto is a non-defective device D1, a position of the probe card 205 is determined so that the first measurement site 205a of the probe card 205 contacts with the above-mentioned device. Consequently, the devices at the positions of X=7 to 9 are set as a contact position.

Since a device at a position of X=10 subsequently thereto is a non-defective device D1, a position of the probe card 205 is determined so that the first measurement site 205a contacts with the above-mentioned device. Consequently, the devices at the positions of X=10 to 12 are set as a contact position.

Since the device at the position of X=13 subsequently thereto is a non-defective device D1, the above-mentioned device is set as a position of contacting with the first measurement site 205a of the probe card 205. However, at this contact position, the third measurement site 205c contacts with a device non-forming region PA, which violates a constrained condition. Therefore, as shown by a left-pointing arrow (←) in FIG. 12, the contact position of the probe card 205 is returned by one on the left side, and is determined so that the second measurement site 205b contacts with the device at the position of X=13. Consequently, the devices at the positions of X=12 to 14 are set as a contact position. At this contact position, the third measurement site 205c does not contact with the device non-forming region PA, and the above-mentioned devices are suitable as a contact position. The probe card 205 leads to contacting with the device at the position of X=12 at two times. However, there arises no problem unless there is a particular limit on the number of times of contact or the limit is violated. Further, the testing by the tester 100 is not performed usually at the contact with the above-mentioned devices at two times. By operations described above, four contact positions are determined with respect to the devices in the third line (Y3). The four contact positions are illustrated by the thick black rectangular regions in the figure.

Contact positions with respect to devices in a fourth line (Y4) to an eighth line (Y8) shown in FIG. 12 and a ninth line (Y9) to a sixteenth line (Y16) shown in FIG. 13 are also determined by the same operation. Incidentally, due to a constrained condition of no contact with the device non-forming region PA, the contact positions of the probe card 205 are returned by one in a left direction in the fourth line (Y4), the sixth line (Y6), and the seventh line (Y7) shown in FIG. 12 as illustrated by a left-pointing arrow (←). Moreover, the contact positions of the probe contact are returned by one or two in the left direction in the tenth line (Y10), the eleventh line (Y11), the twelfth line (Y12), and the thirteenth line (Y13) shown in FIG. 13 as illustrated by a left-pointing arrow (←). By the above operations, sixty-three contact positions are finally determined in the entire wafer W.

Incidentally, in the above method, the search is performed from the device on the left side in determining the contact positions of the probe card 205 with respect to the device in each row, but the search may be performed from the device on the right side. In that case, except for the defective devices as test non-targeted devices and the devices whose contact positions have been determined, the contact positions are determined so that the third measurement site 205c contacts with the non-defective device as a test targeted device on the rightmost side.

Based on the same method, for example, in the probe card of the second embodiment shown in FIG. 10, the contact positions may be determined by cutting out the wafer in the vertical direction (Y-axis direction). Further, for the probe card of the third aspect shown in FIG. 11, the contact positions may be determined so that the measurement site 205a contacts with the non-defective device on the leftmost side with respect to the devices in each row similarly to the above except for the defective devices and the devices whose contact positions have been determined.

FIG. 14 shows the contact positions defined by the above-mentioned method with respect to the devices formed on the wafer W shown in FIG. 9. Rectangular regions illustrated by thick black lines indicate respective contact positions. For the sake of clarity of each contact position, the positions of the devices with which the second measurement site 205b contacts are illustrated by black circles.

In this aspect, by preventing the probe card 205 from contacting with the defective devices as much as possible, as shown in FIG. 14, the tests of the non-defective devices on the entire wafer can be performed at a total of sixty-three times of contact. Meanwhile, in a method of determining the contact positions of the probe card 205 without distinguishing between the non-defective device and the defective device, a total of seventy times of contact of the probe card 205 need to be performed in testing the devices on the entire wafer as shown in FIG. 3. If it is assumed that a test time required to perform the contact at one time is common, it can be seen that the test time per wafer in this aspect is shortened by about 10% in comparison with a case shown in FIG. 3.

Figure 36:
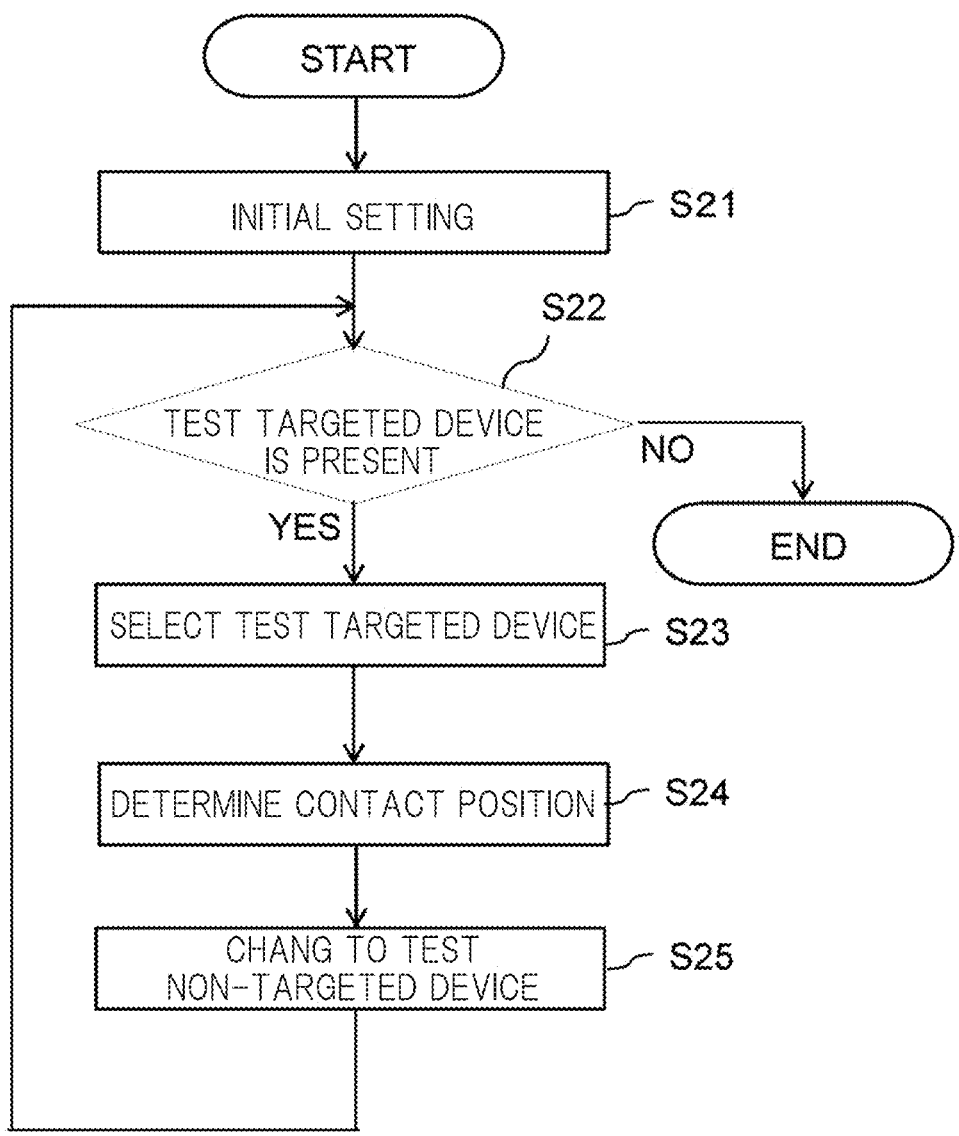
FIG. 36 is a flowchart showing a determining method of contact positions in a second aspect of the first embodiment.
Figure 37:
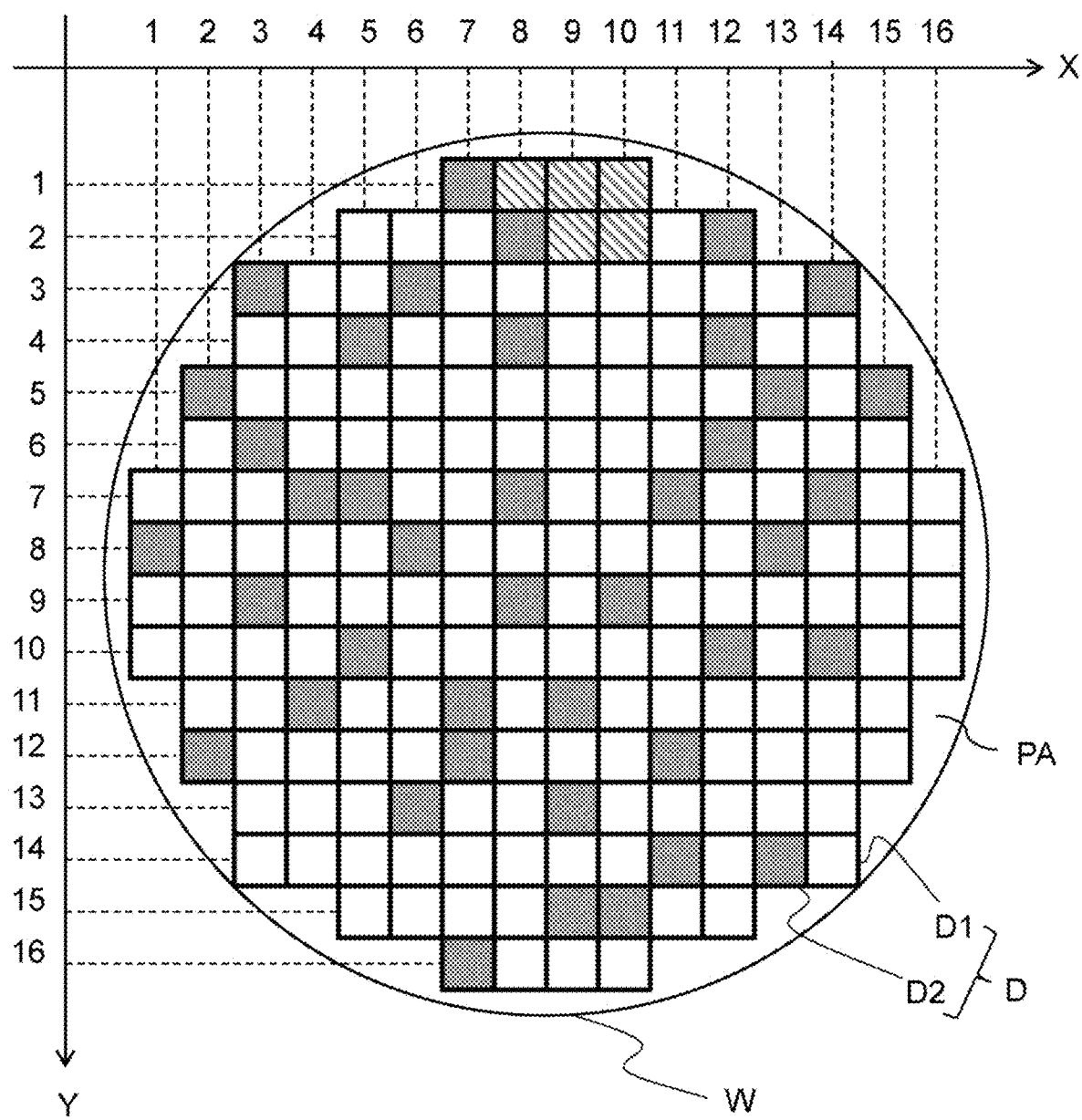
FIG. 37 is a diagram for explaining a determining method of contact positions of a probe card in the second aspect of the first embodiment.
Figure 38:
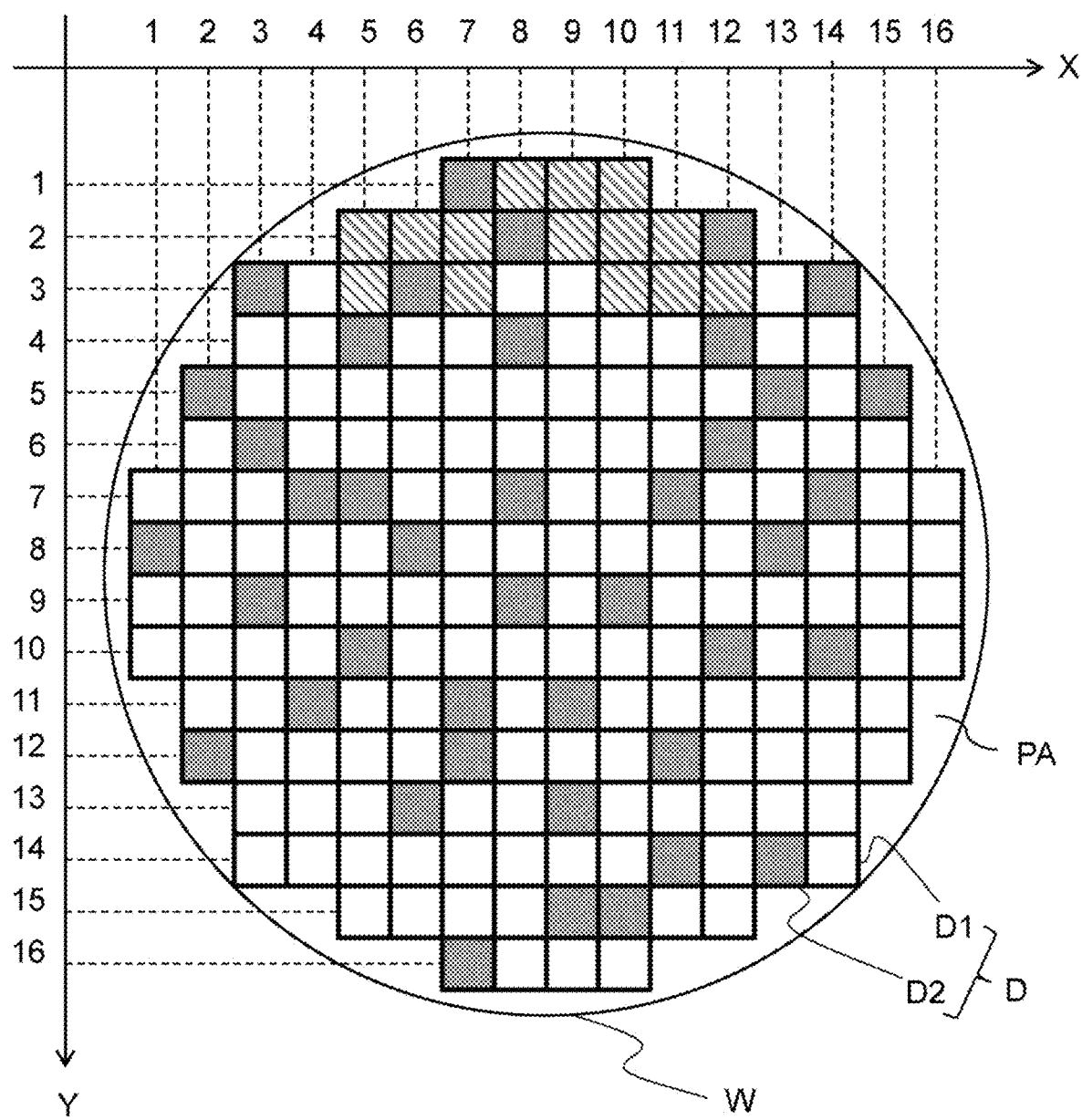
FIG. 38 is a diagram for explaining the determining method of contact positions of the probe card in the second aspect of the first embodiment.

Next, a method of determining the optimum contact position of the probe card in a second aspect of the first embodiment will be described with reference to FIGS. 8 and 35 to 39. FIG. 36 is a flowchart showing a method of determining contact positions in a second aspect of the first embodiment. Each of FIGS. 37 and 38 is a diagram for explaining a determining method of contact positions of the probe card in the second aspect of the first embodiment. In FIGS. 37 and 38 similarly to FIG. 8, a position of each device is represented by an X-axis value and a Y-axis value in order to identify each device. Each vacant device is a non-defective device D1 and is a device that requires contact with the probe card. Each device illustrated in gray is a defective device D2, and is a device that does not require the contact with the probe card. Each device illustrated by diagonal lines is a device whose contact position has been determined.

A forming state of the devices D formed on the wafer W in this aspect is the same as that in the first aspect shown in FIG. 8. The contact positions are determined so that the probe card 205 does not contact with the defective device D2 as much as possible and that any of the measurement sites 205a to 205f of the probe card 205 always contacts with the non-defective device D1. Here, the number of devices arranged in the lateral direction on the wafer W is equal to or more than the number of measurement sites of the probe card 205.

It is assumed that as the probe card 205 of this aspect, a probe card 205 of a fourth embodiment shown in FIG. 35 is used. It is assumed that in contact of the probe card 205 with the devices D, any of the measurement sites 205a to 205f contacts with any device Don the wafer and is prohibited from contacting with the device non-forming region PA.

In this aspect, a contact position is searched for the non-defective device D1 on the uppermost side and the leftmost side except for the defective devices D2 and the devices whose contact positions have been determined.

First, it is assumed that any of the measurement sites 205a to 205f contacts with the above-mentioned non-defective device D1. Then, excluded is a case where any of the measurement sites contacts with the device non-forming region PA by the above-mentioned contact. Further, one contact position most including the non-defective device D1, which excludes the devices whose contact positions have been determined, by the above-mentioned contact is set as a search result this time. By determining the contact position, the non-defective device D1 in the contact position becomes a device, whose contact position has already been determined, and is excluded from the subsequent search. When this operation is repeated and the contact positions of all the non-defective devices D1 have been determined, the determination of the contact positions is completed.

Hereinafter, a determining method of contact positions will be described with reference to the flowchart shown in FIG. 36.

First of all, as an initial setting, the control unit 201 reads an arranging status (map information MPI) of the devices shown in FIG. 8 (step S21). The non-defective device D1 is set as a test targeted device, the defective device D2 is set as a test non-targeted device, and the control unit 201 records the map information MPI in the RAM 201b.

Next, the control unit 201 searches for a test targeted device on the leftmost side (the X-axis value is small) among the devices located at the topmost position (the Y-axis value is small) on the wafer W. In the example shown in FIG. 8, a non-defective device D1 at a position (X=8, Y=1) is selected (steps S22 and S23).

Subsequently, when any of the measurement sites 205c to 205f contacts with the above-mentioned device, any of the measurement sites contacts with the device non-forming region PA, so that the above-mentioned device is excluded. When the measurement site 205a contact therewith, the contact position includes five test targeted devices and when the measurement site 205b contacts therewith, the contact position includes four test targeted devices. Therefore, in this search, the measurement site 205a, which includes the most five test targeted devices as contact positions, is determined as a contact position of contacting with the above-mentioned device (step S24).

The control unit 201 records the contact position determined in step S24 in the RAM 201b, and sets the five test targeted devices in the contact position as test non-targeted devices (step S25). Here, the five test targeted devices are three devices located at positions of (X=8, Y=1), (X=9, Y=1), (X=10, Y=1), and two devices located at positions of (X=9, Y=2) and (X=10, Y=2). The contact positions of these devices have already been determined, and such devices will be excluded from subsequent searches. The five devices shaded in FIG. 37 indicate devices whose contact positions have been determined this time, and indicate that they have become test non-targeted devices.

In order to search for the next contact position in the same manner, the control unit 201 inspects presence or absence of a test targeted device(s) (step S22). Then, a device located at the topmost and leftmost position (X=5, Y=2) is selected as a test targeted device (step S23). If the above-mentioned device is intended to contact with the measurement sites 205b to 205f, any of the measurement sites may contact with the device non-forming region PA. The measurement site of the probe card 205 that can contact with the above-mentioned device is only the measurement site 205a, and this position is determined as a contact position (step S24). The number of test targeted devices included in this contact position is five. They are three devices located at positions of (X=5, Y=2), (X=6, Y=2), and (X=7, Y=2), and two devices located at positions (X=5, Y=3) and (X=7, Y=3). Then, the control unit 201 registers, as test non-targeted devices, these test targeted devices in the RAM 201b (step S25).

A test targeted device (s) to be next selected is a device located at a position of (X=11, Y=2) (steps S22 and S23). When the measurement site 205a contacts with the above-mentioned device, the measurement site 205c leads to contacting with the device non-forming region PA and this is inappropriate, so that the above-mentioned device is excluded from a candidate of a contact position. When the measurement site 205b contacts with the above-mentioned device, four test targeted devices are included in the contact position. Even when the measurement site 205c contacts with the above-mentioned device, the four test targeted devices are included in a contact region. When the measurement sites 205d to 205f contact with the above-mentioned device, the measurement site 205f contacts with the device non-targeted region PA and this is inappropriate, so that the above-mentioned device is excluded from a candidate of a contact position. Consequently, the contact position is determined as a position with which the measurement site 205b contacts (step S24), and the control unit 201 registers the contact position in the RAM 201b. The test targeted devices included in this contact position are four devices located at positions of (X=11, Y=2), (X=10, Y=3), (X=11, Y=3) and (X=12, Y=3). The control unit 201 records, as test non-targeted devices, these devices in the RAM 201b.

A status of the devices on the wafer W, which are changed from the test targeted device to the test non-targeted device by the above-described determination of the contact positions, is illustrated by diagonal lines in FIG. 38.

Thereafter, the contact positions are determined in order by the same operation, and a contact-position determining procedure ends when the test targeted devices finally disappear.

In this aspect, the method of determining the contact positions has been described by taking a case where the measurement site of the probe card 205 has 2 rows and 3 columns as an example. However, even if the measurement site of the probe card has m rows and n columns (m and n are integers of 2 or more), the determining method of the contact positions does not change. Further, it is possible to determine the contact positions in the same manner even when the measurement sites of the probe card are arranged not continuously but intermittently.

Figure 15:
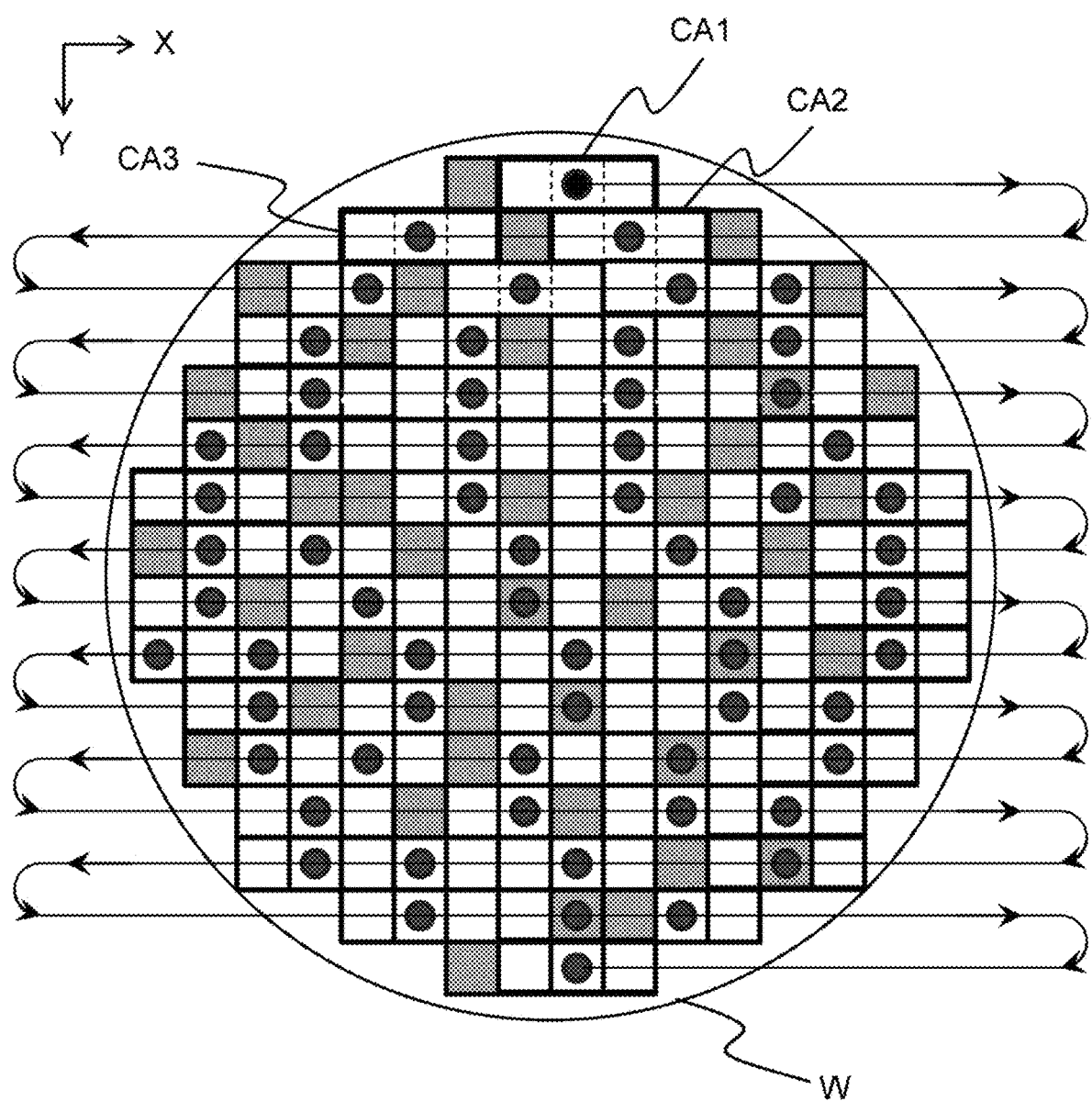
FIG. 15 is a diagram for explaining a determining method of contact order in an aspect of the first embodiment.

Next, a method of determining order in which the probe card contacts with the determined contact position will be described with reference to FIG. 15. FIG. 15 is a diagram for explaining a method of determining contact order in the aspect of the first embodiment.

With respect to the determined contact positions shown in FIG. 14, as shown in FIG. 15, the control unit 201 determines contact order in a zigzag manner from a top side toward a bottom side of the wafer W. Here, the Y-axis direction is the vertical direction, and positions of the devices, with which the second measurement site 205b contacts, are illustrated by black circles similarly to those of FIG. 14. That is, since the contact position in the first row is only one, this contact position is set as a first contact position CA1. Since two contact positions are defined in the second line, the contact position on the right side is set as a second contact position CA2 and the contact position on the left side is set as a third contact position CA3. Since four contact positions are defined in the third line, they are set as fourth to seventh contact positions in order from the left side.

Similarly subsequently thereto, the contact positions are selected from the right side or left side, and this selection is set as contact order. With such a selecting method, in adjusting the positions of the probe card 205 and the devices D on the wafer W by the position control unit 204 at the time of executing the test, mutually moving distances can be relatively reduced.

Figure 16:
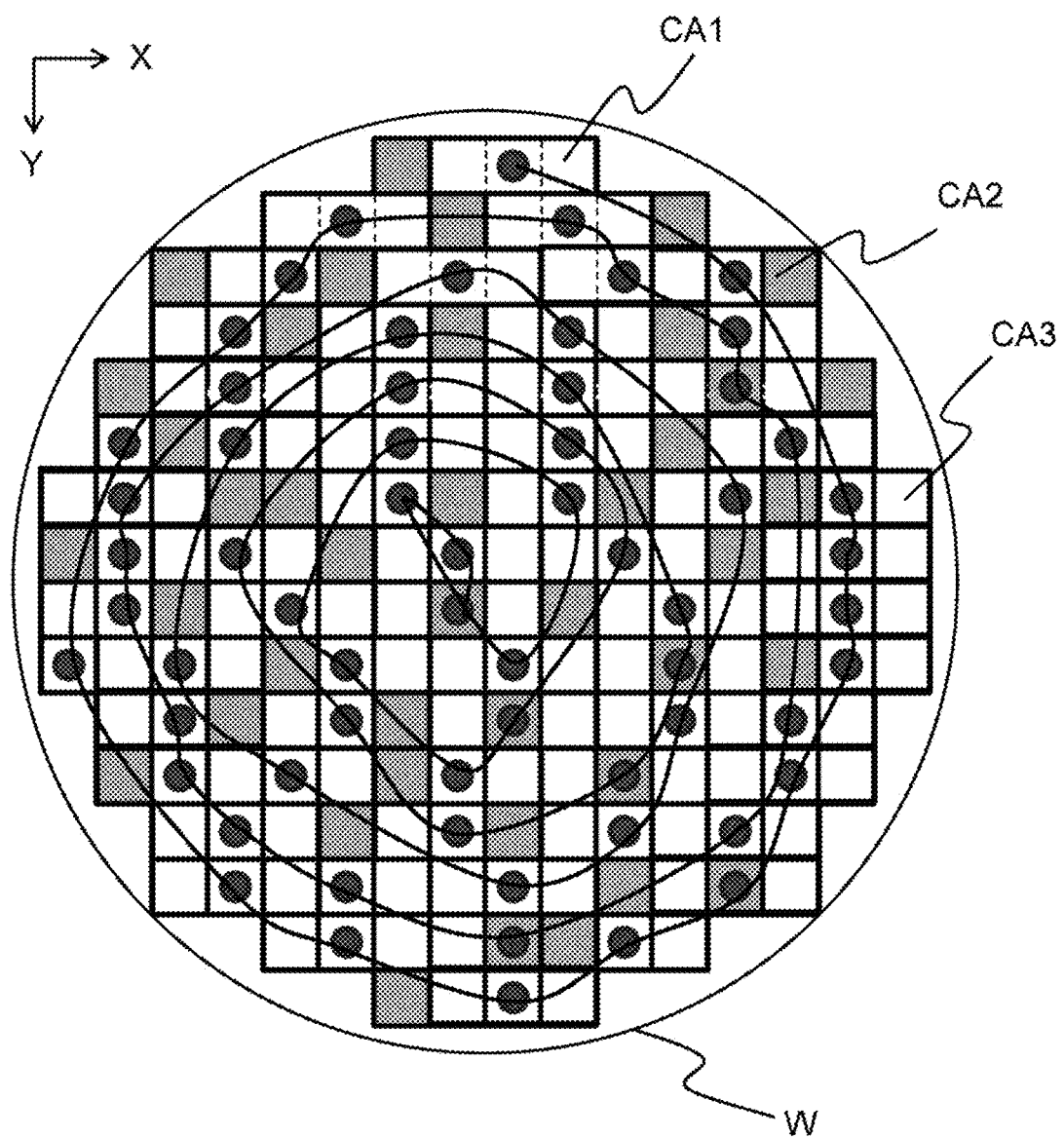
FIG. 16 is a diagram for explaining another determining method of contact order in the aspect of the first embodiment.

Next, another determining method of contact order will be described with reference to FIG. 16. FIG. 16 is a diagram for explaining a method of determining another contact order in an aspect of the first embodiment.

With respect to the defined contact positions shown in FIG. 14, as shown in FIG. 16, the control unit 201 determines contact order that starts from a contact position CA1 on an outer-circumference side of the wafer, helically follows contact positions CA2, CA3, and verges toward a central side. Consequently, the moving distance of the probe card is minimized between the continuous contact positions. That is, a relatively moving distance between the probe card 205 and the wafer W can be minimized. The contact order may be determined so as to start from the contact position on the central side of the wafer, helically follow the contact positions, and verge toward the outer circumferential side of the wafer.

Figure 17:
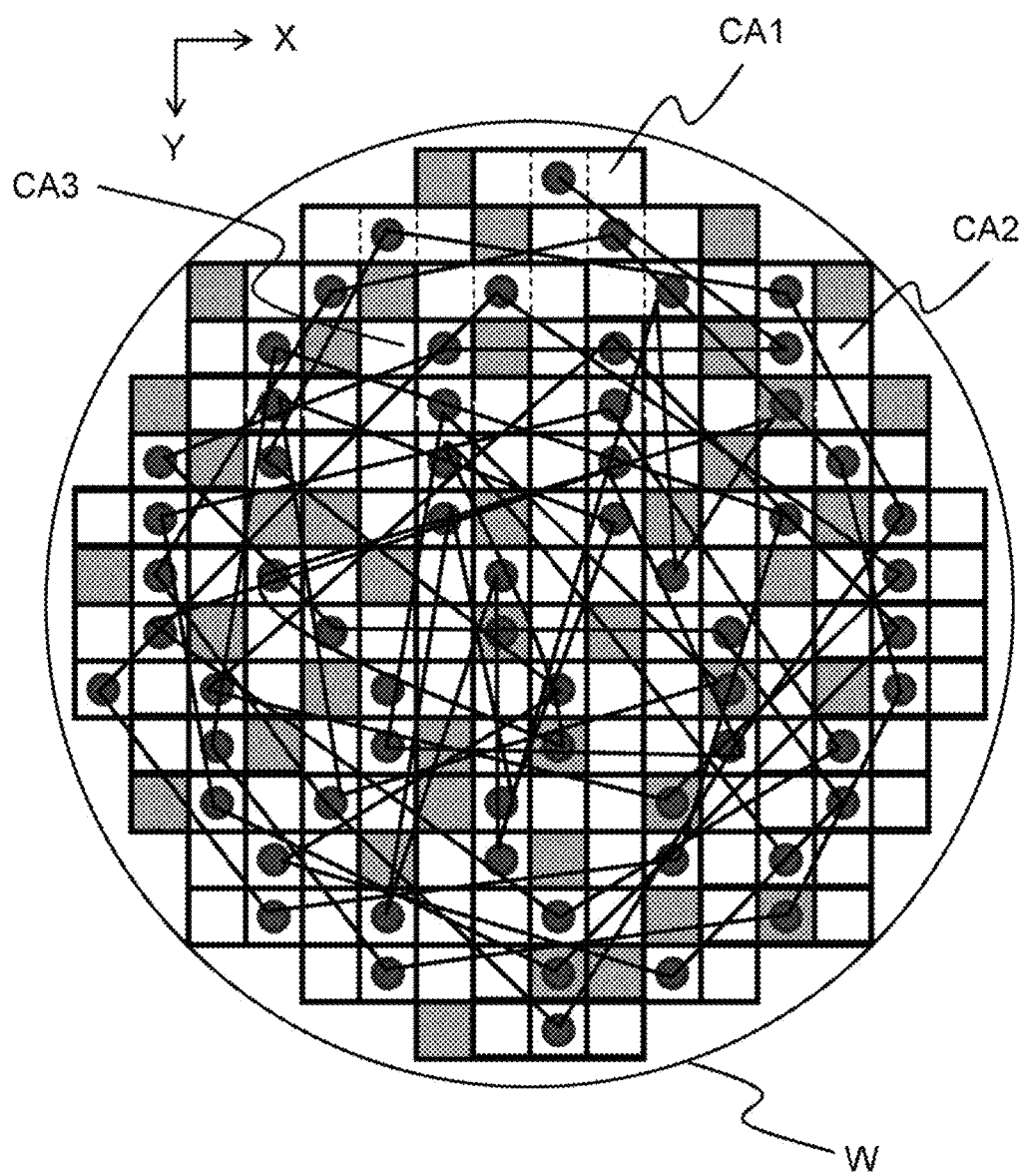
FIG. 17 is a diagram for explaining yet another determining method of contact order in the aspect of the first embodiment.

Next, a determining method of yet another contact order will be described with reference to FIG. 17. FIG. 17 is a diagram for explaining a method of determining another contact order in the aspect of the first embodiment.

With respect to the defined contact positions illustrated by FIG. 14, as shown in FIG. 17, the control unit 201 determines contact order. Here, the contact order is illustrated so that, on the continuous contact positions of the probe card, a distance between the contacting devices on the wafer is set to a fixed value or more or a fixed value or less. For example, continuous contact, that is, contact order is determined to select a device, which performs the next test at a constant distance on the wafer, so that heat generation or the like of the devices by the previous test is not affected to the device serving as the next test target.

Figure 18:
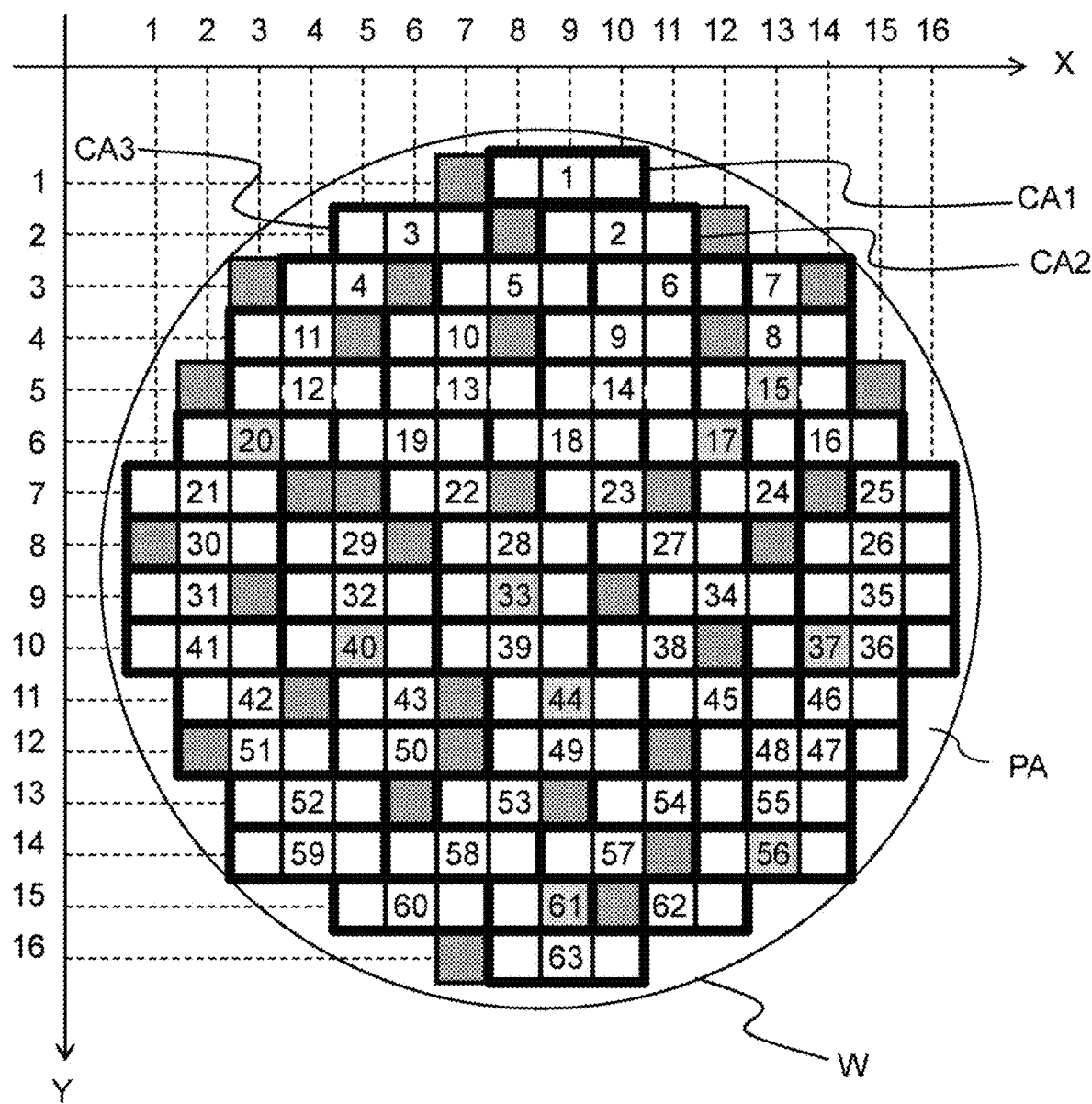
FIG. 18 is a diagram representing order of contact with the contact positions illustrated in FIG. 14 according to the contact order shown in FIG. 15.
Figure 19:
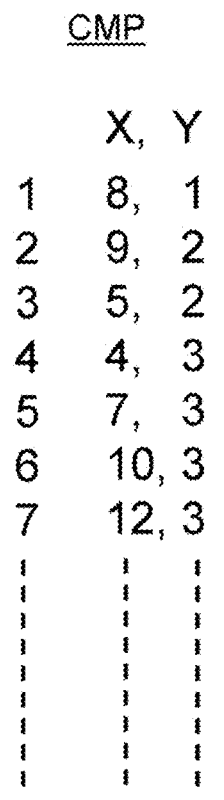

The contact map will be described with reference to FIGS. 18 and 19. FIG. 18 is a view showing order of contact with the contact positions shown in FIG. 14 according to the contact order illustrated in FIG. 15. FIG. 19 is a view showing an example of a contact map indicating information on the contact positions and the contact order shown in FIG. 18. Rectangular regions of thick black lines illustrated in FIG. 18 are contact positions, and the numerical values in the contact positions are order of contact.

As shown in FIG. 19, a position of a device with which the first measurement site 205a of the probe card 205 contacts at the first contact position CA1 is (X=8, Y=1). This is described in a first line of the contact map CMP shown in FIG. 19. Similarly, a position of a device with which the first measurement site 205a contacts at the second contact position CA2 is (X=9, Y=2), and this is described in a second line of the contact map CMP. A position of a device with which the first measurement site 205a contacts at the third contact position CA3 is (X=5, Y=2), and this is described in a third line of the contact map. The same applies to a fourth and subsequent lines. In the contact map CMP shown in FIG. 19, the numbers indicated on the left side are contact order.

In this aspect, an example in which the non-defective device D1 is a test targeted device and the defective device D2 is a test non-targeted device has been described, but the device requiring the test may be a test targeted device and the device not requiring the test may be a test non-targeted device from another viewpoint.

In the present embodiment, the probe card is caused to contact with the test targeted device so as to be identified as a test non-targeted device in advance by the dynamically determined contact map and so as to avoid the test non-targeted device. This makes it possible to reduce the total number of times of contact of the probe card with all the devices on the wafer as compared to a case where the contact positions are statically predetermined. Since the number of times of contact is proportional to the test time, the test time required per wafer is shortened and the test efficiency is improved by reducing the number of times of contact.

Further, in the present embodiment, since the order in which the probe card contacts with the test targeted devices is determined according to a predetermined policy, a distance between the contact positions of the continuous tests can be adjusted. Consequently, an influence of temperature's rise or the like on the to-be-measured device in the previous test can be avoided by keeping an appropriate distance, and the test can be performed under the optimum conditions, that is, the expected test conditions. This brings improvement of test quality.

Second Embodiment

Next, a test apparatus according to a second embodiment will be described. In a second embodiment, described will be an example of optimizing contact positions of the probe card when devices formed on the wafer have a test targeted device, a test non-targeted device, and a test prohibited device. Here, the test prohibited device is, for example, a device with which the probe card is prohibited from contacting, and is also referred to as a contact prohibited device.

A configuration of the test apparatus according to the second embodiment is the same as the configuration of the test apparatus shown in FIG. 5. An operation of the test apparatus according to the second embodiment is the same as the operation of the test apparatus shown in FIG. 6.

Next, an operation of making a contact map in the second embodiment will be described mainly about parts different from that in the first embodiment by using the flowchart shown in FIG. 7.

(Reading of Map Information: Step S11)

The control unit 201 reads the map information MPI of the devices D from the storage unit 203 or the like similarly to the first embodiment. The map information MPI includes position information of each device D; and information of test targeted devices, test non-targeted device, and test prohibited devices as unique information of each device.

(Reading of Probe-Card Form Information: Step S12)

The control unit 201 reads probe-card form information PCI from the storage unit 203 or the like similarly to the first embodiment.

(Determination of Contact Position: Step S13)

The control unit 201 determines the optimum contact position of the probe card 205 based on the map information MPI and the probe-card form information PCI. In this case, the control unit 201 determines contact positions of contacting with all the test-targeted devices on the wafer W as much as possible with the minimum number of times of contact so that the probe card 205 does not contact with the test non-targeted devices as much as possible and never contacts with the test prohibited devices. In this case, whether the measurement sites 205a to 205c of the probe card 205 may contact with the device non-forming regions PA is given as a constrained condition in advance. Incidentally, depending on the above-mentioned constrained condition and the positions of the test prohibited devices, the test targeted devices unable to absolutely contact therewith may be present. However, in such a case, the tests of the above-mentioned devices are impossible and lead to making defect-product determination.

When the control unit 201 determines the contact positions, it then determines the contact order to generate the contact map CMP. The subsequent operations are the same as the operations of steps S14 and S15 of the first embodiment.

Figure 20:
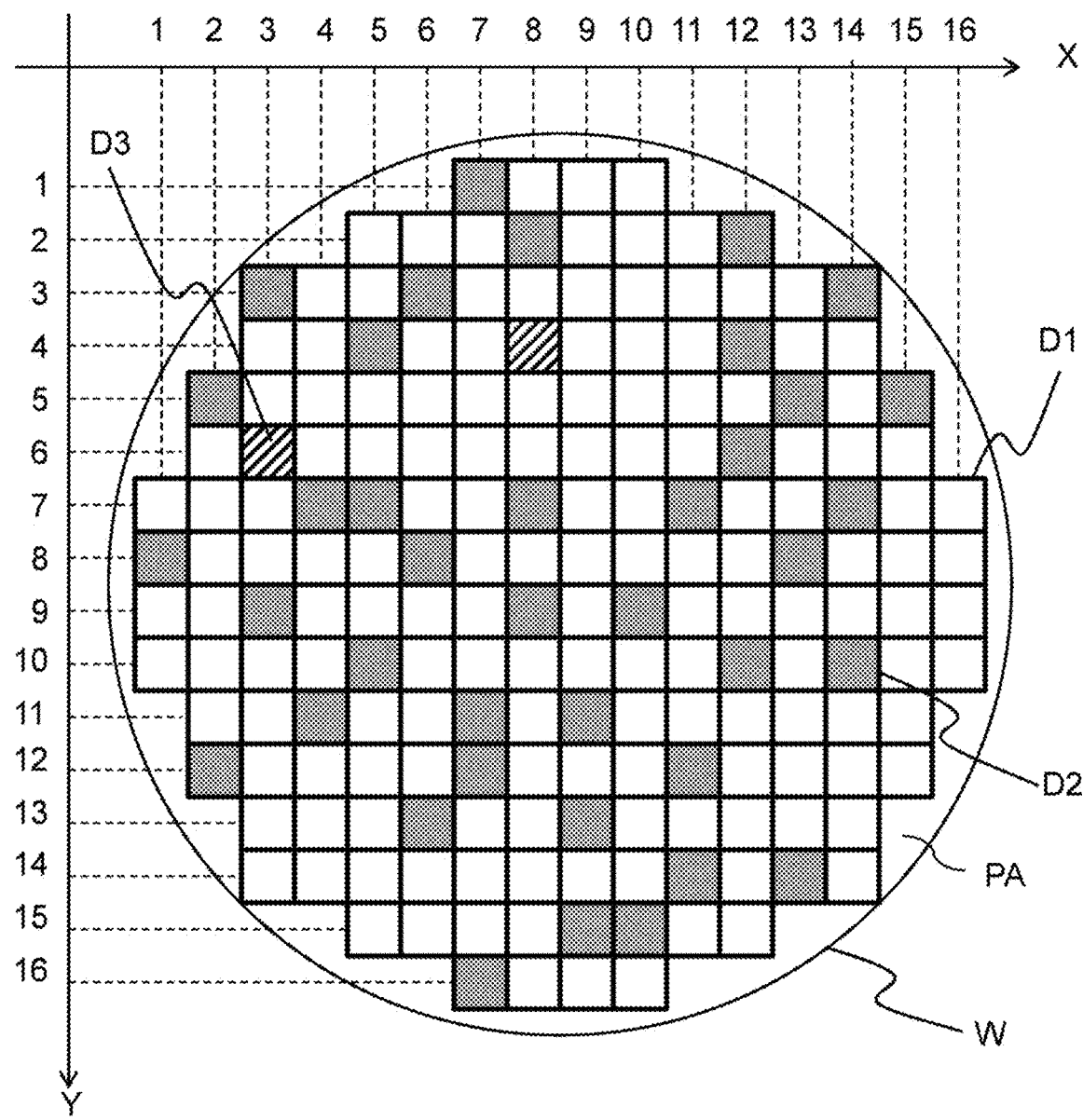
FIG. 20 is a view showing a forming state of devices in an aspect of a second embodiment.

Next, an aspect of the second embodiment will be described with reference to FIG. 20. FIG. 20 is a view showing a forming state of devices in an aspect of the second embodiment.

A non-defective device D1, a defective device D2, and a contact prohibited device D3 are formed on the wafer W. Each vacant device is the non-defective device D1 and is a test-targeted device. Each device illustrated in gray is the defective device D2 and is a test non-targeted device. Each device shown by diagonal lines, for example, a device at a position of (X=3, Y=6) is the contact prohibited device D3. The probe card 205 needs to contact with the non-defective device D1, and the probe card 205 does not need to contact with the defective device D2. Meanwhile, the contact prohibited device D3 is, for example, a device that may destroy the probe card 205 by the contact with the probe card 205 due to a bump defect, and the probe card 205 is prohibited from contacting therewith. The contact prohibited device D3 is found by visual inspection or the like of the wafer W.

The probe card used in this aspect is the probe card 205 of the first embodiment shown in FIG. 2. Further, it is assumed that also in this aspect, the probe card 205 is prohibited from contacting with the device non-forming region PA.

Figure 21:
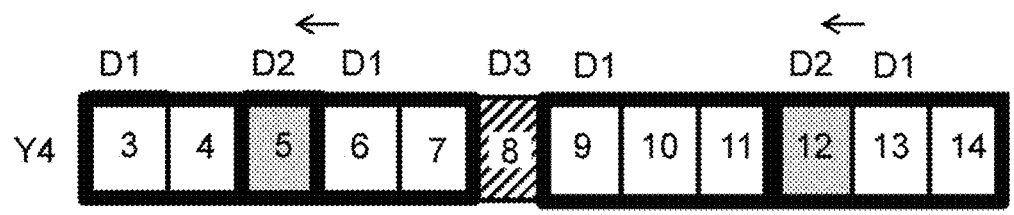
FIG. 21 is a diagram for explaining a determining method of contact positions in an aspect of the second embodiment.
Figure 21:
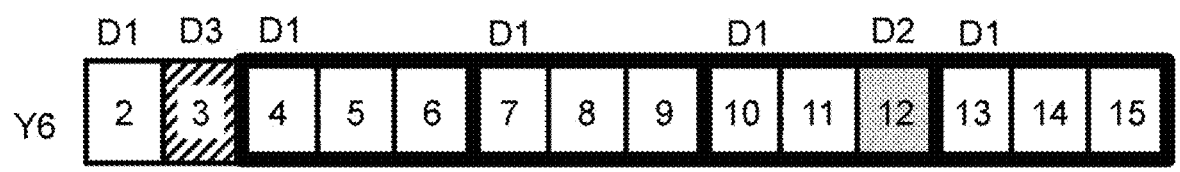

A determining method of contact positions in this aspect will be determined with reference to FIG. 21. FIG. 21 is a diagram for explaining a determining method of contact positions in an aspect of the second embodiment.

FIG. 21 is a view in which the devices in a fourth and sixth rows are extracted from the devices shown in FIG. 20. A forming state of devices in a row(s) other than those rows is the same as that in the aspect of the first embodiment, and contact positions of the probe card is determined in the same manner.

In this aspect, the contact positions are determined in principle so that the first measurement site 205a on the leftmost side contacts with the non-defective device D1 on the leftmost side except for the defective devices D2 and the devices whose contact positions have been determined. However, when the measurement sites 205b, 205c are located at the contact prohibited device D3 or in the device non-forming region PA, the contact positions are determined by returning the third measurement site 205c on the rightmost side to a device other than a contact prohibited device D3 and to a region in which the device is formed. Further, if the measurement sites 205a, 205b are located at the contact prohibited device D3 or in the device non-forming region PA, the test cannot be performed.

The control unit 201 searches for contact positions of the probe card 205 with respect to devices located at positions in a fourth line (Y4) shown in FIG. 21. In searching for each device from the left side, a device at a position of X=3 is a non-defective device D1, and the first measurement site 205a of the probe card 205 is caused to contact with the above-mentioned device. Consequently, the devices at positions of X=4 and 5 also contact with the probe card 205, and the devices at the positions of X=3 to 5 are set as a contact position.

A device at a position of X=6 subsequently thereto is a non-defective device D1, and the first measurement site 205a of the probe card 205 is caused to contact with the above-mentioned device. By doing so, the second measurement site 205b contacts with a device at a position of X=7, and the third measurement site 205c contacts with a device at a position of X=8. However, the device at the position of X=8 is a contact prohibited device D3, so that the probe card 205 is prohibited from contacting therewith. Therefore, the contact position of the probe card 205 is returned by one in the left direction, and the contact position is set so that the first measurement site 205a contacts with the device at the position of X=5. In this case, none of the measurement sites 205a to 205c contacts with the contact prohibited device D3 and with the device non-forming region PA, so that they can contact therewith and the devices at the positions of X=5 to 7 are set as a contact position.

Since a device at a position of X=9 subsequently thereto is a non-defective device D1, the first measurement site 205a of the probe card 205 is caused to contact with the above-mentioned device. In that case, the second measurement site 205b contacts with a device at a position of X=10, and the third measurement site 205c contacts with a device at a position of X=11. Since all of these devices are not contact prohibited devices D3 and are in a region which they exist, they can contact therewith and the devices at the positions of X=9 to 11 are set as a contact position.

A device at a position of X=12 subsequently thereto is a defective device D2, so that the above-mentioned device is excluded. Since a device at a position of X=13 next thereto is a non-defective device D1, the first measurement site 205a of the probe card 205 is caused to contact with the above-mentioned device. However, in that case, since the third measurement site 205c becomes a device non-forming region PA, it is inappropriate as a contact position, so that the contact position is returned by one in the left direction and the probe card 205 is caused to contact with the devices at the positions of X=12 to 14. In this case, the contact prohibited device D3 is not included in the contact position, and the device exists also at any of the measurement sites 205a to 205c, so that it is appropriate to a contact position and the devices at the positions of X=12 to 14 are set as a contact position. Since no device to be searched exists in the fourth line, the search for this line ends.

Next, the control unit 201 searches for contact positions of the probe card 205 with respect to devices at positions in a sixth row (Y6) shown in FIG. 21. In searching for each device from the left side, a device at X=2 on the leftmost side is a non-defective device D1, so that the first measurement site 205a of the probe card 205 is caused to contact therewith. However, in this case, a device at a position of X=3, with which the second measurement site 205b contacts, is the contact prohibited device D3 and cannot contact therewith. Therefore, the contact position of the probe card 205 is intended to return on the left side by one, but this leads to causing the first measurement site 205a to contact with the device non-forming region PA, which is inappropriate to a contact position. Therefore, the contact of the probe card 205 with the device at the position of X=2 is abandoned, and the test of the above-mentioned device is regarded as impossible.

A device at a position of X=3 subsequently thereto is a contact prohibited device D3, and the next device is searched for. A device at a position of X=4 is a non-defective device, and the first measurement site 205a of the probe card 205 is caused to contact with the above-mentioned device. In that case, the second measurement site 205b leads to contacting with a device at a position of X=5, and the third measurement site 205c leads to contacting with a device at a position of X=6. Both devices are non-defective devices D1, which is appropriate to a contact position. The devices at the positions of X=4 to 6 are defined as a contact position.

A device at a position of X=7 subsequently thereto is a non-defective device D1, and the devices at the positions of X=7 to 9 are set as a contact position similarly to the above. Hereinafter, similarly, devices at positions of X=10 to 12 and devices at positions of X=13 to 15 are defined as contact positions.

In determining the contact positions with respect to the devices at the positions in the sixth line (Y6), there may be a device(s) unable to be tested by contact impossibility in spite of the non-defective devices D1 due to the existence of the contact prohibited device D3. This is an unavoidable situation, so that such a situation is accepted to determine the contact positions.

By the above operation, the contact positions of the probe card 205 with respect to the devices including the contact prohibited device D3 formed on the wafer W are determined.

Incidentally, when the probe card 205 is allowed to contact with the device non-forming region PA, the contact position with respect to the device at the position of X=2 in the sixth row (Y6) becomes a position where the third measurement site 205c contacts with the device at the position of X=2. In this case, the first measurement site 205a and the second measurement site 205b lead to contacting with the device non-forming region PA.

In the present embodiment, an example in which the map information includes the test targeted device, the test non-targeted device, and the test prohibited device has been described, but the map information may not include the information on the test non-targeted device.

In the present embodiment, the contact map is dynamically generated by analyzing the position information of the test prohibited devices for each wafer. Consequently, the test can be performed even if the position of the test prohibited device is different for each wafer. Incidentally, if the contact positions of the probe card are determined in advance, the test cannot be performed when the test-prohibited devices different for each wafer exist.

Further, in the present embodiment, even when the test prohibited devices are present in addition to the test non-targeted devices, the number of times of contact of the probe card can be reduced similarly to that in the first embodiment, which makes it possible to reduce the time required for the testing in units of wafer.

Third Embodiment

Next, a test apparatus according to a third embodiment will be described. Similarly to the first embodiment, the third embodiment optimizes the contact positions of the probe card having the plurality of measurement sites when the devices formed on the wafer include the test targeted devices and the test non-targeted devices. Further described in the third embodiment will be an example of optimizing the contact positions of the probe card when one or more measurement sites among the plurality of measurement sites of the probe card cannot be used.

A configuration of a test apparatus according to a third embodiment is the same as the configuration of the test apparatus shown in FIG. 5. An operation of the test apparatus according to the third embodiment is the same as the operation of the test apparatus shown in FIG. 6.

Next, an operation of making a contact map in the third embodiment will be mainly described on parts different from those in the first embodiment by using the flowchart illustrated in FIG. 7.

(Reading of Map Information: Step S11)

The control unit 201 reads the map information MPI of the devices D from the storage unit 203 or the like similarly to the first embodiment. The contents of the map information MPI are the same as those of the first embodiment.

(Reading of Probe-Card Form Information: Step S12)

The control unit 201 reads the probe-card form information PCI from the storage unit 203 or the like similarly to the first embodiment. The probe-card form information PCI includes, in addition to the information in the first embodiment, information on which measurement sites cannot be used.

(Determination of Contact Position: Step S13)

The control unit 201 determines the optimum contact position of the probe card with respect to the devices based on the map information MPI and the probe-card form information PCI. In determining the contact positions, the optimum contact position is set as such a contact position as to have the minimum number of times of contact testable with respect to all the test targeted devices among the devices formed on the wafer W based on the following constrained condition(s) and the like. Incidentally, the following constrained condition is set in advance.

(1) Preventing the probe card 205 from contacting with the test non-targeted device as much as possible;
(2) Making sure that the valid measurement sites contact with all the test targeted devices on the premise that the testing is impossible in the measure sites unusable among the measurement sites 205a to 205c of the probe card 205; and
(3) Either prohibiting the probe card 205 from contacting with the device non-forming region PA or allowing the probe card to contact with the device non-forming region PA.

When the control unit 201 determines the contact positions, it then determines the contact order and generates the contact map CMP. However, the subsequent operations are the same as the operations of steps S14 and S15 of the first embodiment.

Next, an aspect in the third embodiment will be described. The premise of the aspect of the third embodiment will be described with reference to FIGS. 2 and 8.

As shown in FIG. 8, the non-defective devices D1 and the defective devices D2 are formed on the wafer W. As described above, the vacant devices are the non-defective devices D1 and are the test targeted devices. The devices illustrated in gray are the defective devices D2, and are the test non-tested devices.

The probe card 205 is the same as that used in the aspect of the first embodiment, and is the probe card of the first embodiment shown in FIG. 2. It is assumed that the second measurement site 205b is inappropriate for measurement due to a failure or a reason(s) that is unknown but has a poor test yield. Here, the test yield is a ratio at which non-defective products are judged in the test. Further, it is assumed that similarly to the aspect of the first embodiment also in this aspect, the probe card 205 is prohibited from contacting with the device non-forming region PA.

A method of determining contact positions in this aspect will be described with reference to FIGS. 22 to 27. Each of FIGS. 22 to 27 is a diagram for explaining a method of determining contact positions in the aspect of the third embodiment.

FIGS. 22 to 26 are obtained by cutting out the devices illustrated in FIG. 8 from above the wafer for each row. The numerical value described for each device indicates a position of the device as a value on the X axis. In FIGS. 22 to 26, thick black line rectangles indicate contact positions CP1 to CP6 for each line of the probe card 205. The numerical values written inside the contact positions CP1 to CP6 represent the numbers that identify the measurement sites 205a to 205c of the probe card 205. The numeral value "1" represents the first measurement site 205a, "2" represents the second measurement site 205b, and "3" represents the third measurement site 205c.

In this aspect, the contact positions are determined in principle so that the first measurement site 205 as a measurement site measurable on the leftmost side is caused to contact with the non-defective device D1 on the leftmost side except for the defective devices D2 and the devices whose contact positions have been determined. As a result, it may contact with the defective device D2, but this is allowed. However, when the measurement sites 205b, 205c as measurement sites measurable on the right side are located in the device non-forming regions PA, the contact position is determined by returning the third measurement site 205c as a measurement site measurable on the rightmost side to a region where the device is formed. As a result, it may contact with the defective device D2 or the device whose contact position has been determined, but this is allowed.

Figure 22:
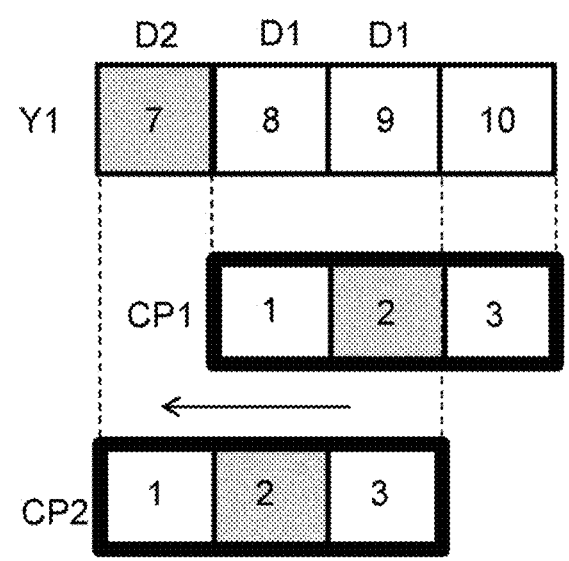
FIG. 22 is a diagram for explaining a determining method of contact positions in an aspect of a third embodiment.

The control unit 201 searches for contact positions of the probe card 205 with respect to devices at positions in the first line (Y1) shown in FIG. 22. In searching for each device from the left side, a device at a position of X=7 is excluded since it is a defective device D2. Since a device at a position of X=8 next thereto is a non-defective device, the first measurement site 205a of the probe card 205 is caused to contact with the above-mentioned device. By this contact, the second measurement site 205b contacts with a device at a position of X=9, and the third measurement site 205c contacts with a device at a position of X=10. However, the second measurement site 205b cannot be used for use impossibility, the device at the position of X=9 is not tested, and only the device at the position of X=8 and the device at the position of X=10 can be tested. Consequently, a first contact position CP1 of the probe card 205 is set as a contact position of the devices at the positions of X=8 to 10.

Since the device at the position of X=9 subsequent thereto is a non-defective device D1, the first measurement site 205a of the probe card 205 is caused to contact with the above-mentioned device. However, by doing so, the third measurement site 205c is located in the device non-forming region PA, which is inappropriate to a contact position. Therefore, the contact position is determined so as to return the contact position by two on the left side and so that the third measurement site 205c contacts with the device at the position of X=9. In this case, the first measurement site 205a contacts with the deice at the position of X=7 and this is appropriate to a contact position, and the devices at the positions of X=7 to 9 are set as a second contact position CP2. As described above, all the contact positions in the first line (Y1) are determined by the first contact position CP1 and the second contact position CP2.

Figure 23:
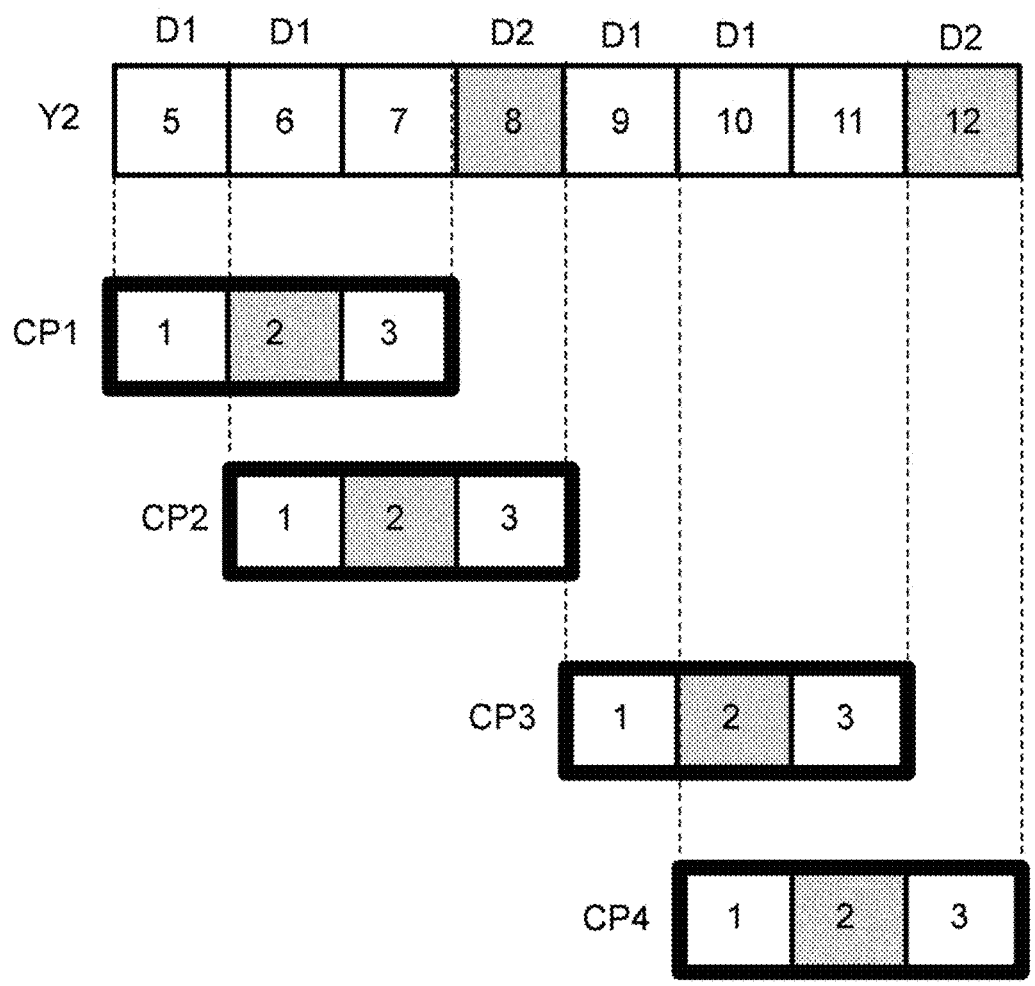
FIG. 23 is a diagram for explaining the determining method of contact positions in the aspect of the third embodiment.

Next, the control unit 201 searches for contact positions of the probe card 205 with respect to devices at positions in a second line (Y2) shown in FIG. 23. In searching for each device from the left side, a device at a position of X=5 is a non-defective device, and the first measurement site 205a of the probe card is caused to contact with this device. Consequently, the second measurement site 205b leads to contacting with a device at a position of X=6, and the third measurement site 205c leads to contacting with a device at a position of X=7, so that the devices at the positions of X=5 to 7 are set as the first contact position CP1. However, although the device at the position of X=6 is the non-defective device D1, its contact position remains still undetermined since the above-mentioned device contacts with the unusable second measurement site 205b. Therefore, it is assumed that the first measurement site 205a is caused to contact with the device at the position of X=6. Consequently, the devices at the positions of X=6 to 8 are set as the second contact position CP2.

When the first measurement site 205a of the probe card is caused to contact with a device at a position of X=9 subsequently thereto, devices at positions of X=10 and 11 contact therewith, so that the devices at the positions of X=9 to 11 are set as a third contact position CP3. However, the device at the position of X=10 is the non-defective device D1, but its contact position remains undetermined, so that the contact positions capable of testing the non-defective devices in the second line are finally determined by setting the devices at the positions of X=10 to 12 as a fourth contact position CP4.

Figure 24:
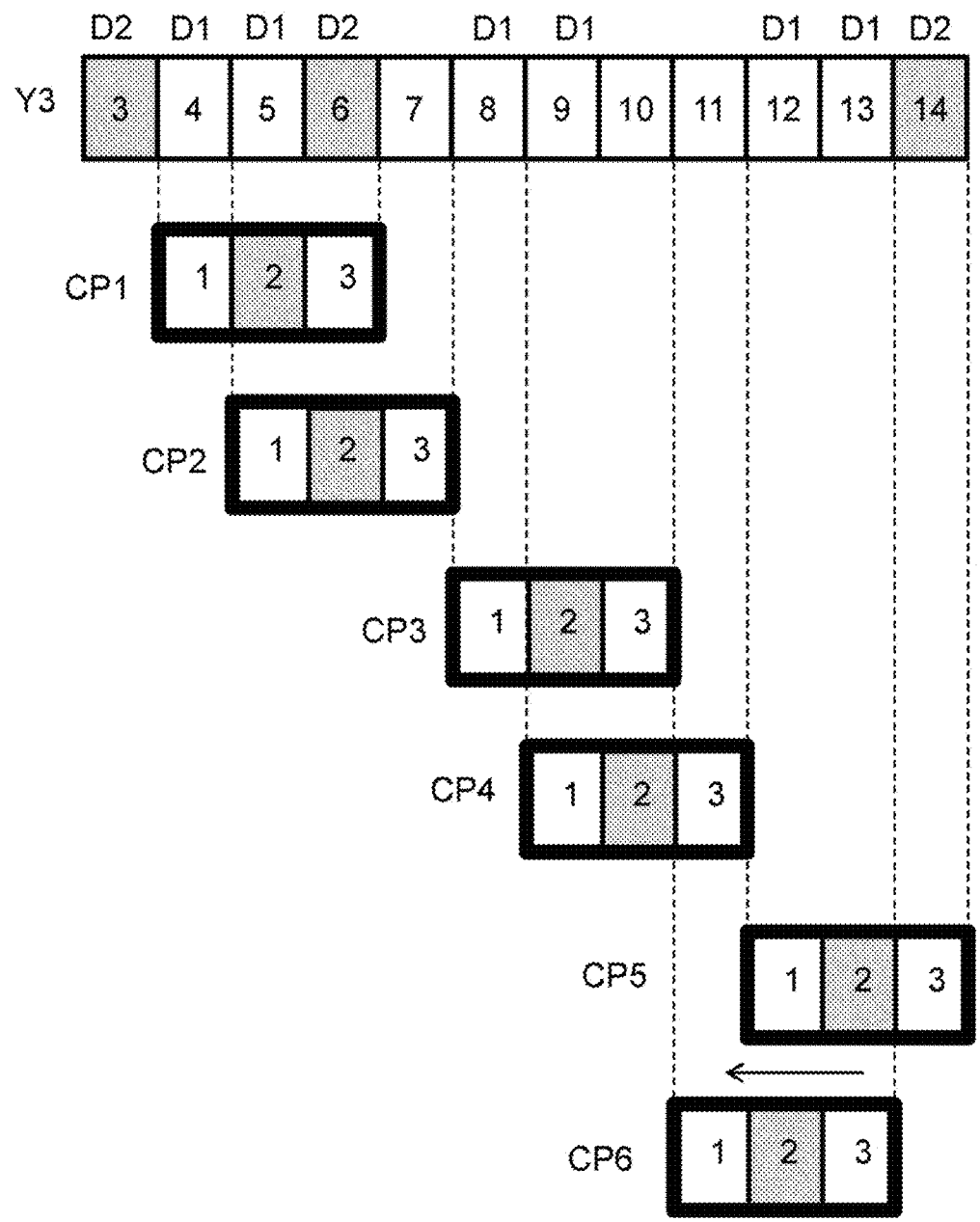
FIG. 24 is a diagram for explaining the determining method of contact positions in the aspect of the third embodiment.

Next, the control unit 201 searches for contact positions of the probe card 205 with respect to devices at positions in a third row (Y3) shown in FIG. 24. In searching for each device from the left side, a device at a position of X=3 is a defective device D2 and so is excluded. Since a device at a position of X=4 next thereto is a non-defective device D1, the devices at the positions of X=4 to 6 are set as a first contact position CP1. By doing so, the device at the position of X=5 is the non-defective device D1, but its contact position remains undetermined, so that the devices at the positions of X=5 to 7 are set as a second contact position CP2.

Subsequently, a device at a position of X=8 is a non-defective device D1, so that the devices at the positions of X=8 to 10 are set as a third contact position CP3. By doing so, the device at the position of X=9 is a non-defective device D1, but its contact position remains undetermined, so that the devices at the positions of X=9 to 11 are further set as a fourth contact position CP4.

Subsequently, a device at a position of X=12 is the non-defective device D1, so that the devices at the positions of X=12 to 14 are set as a fifth contact position CP5. By doing so, the device at the position of X=13 is a non-defective device D1, but its contact position remains undetermined. When the device at the position of X=13 is intended to contact with the first measurement site 205a, the third measurement site 205c becomes a device non-forming region PA. Therefore, the contact position is returned by two in the left direction so that the third measurement site 205c contacts therewith. The devices at the positions of X=11 to 13 are set as a sixth contact position CP6. This makes it possible to test all the non-defective devices at the positions in the third line (Y3).

Figure 25:
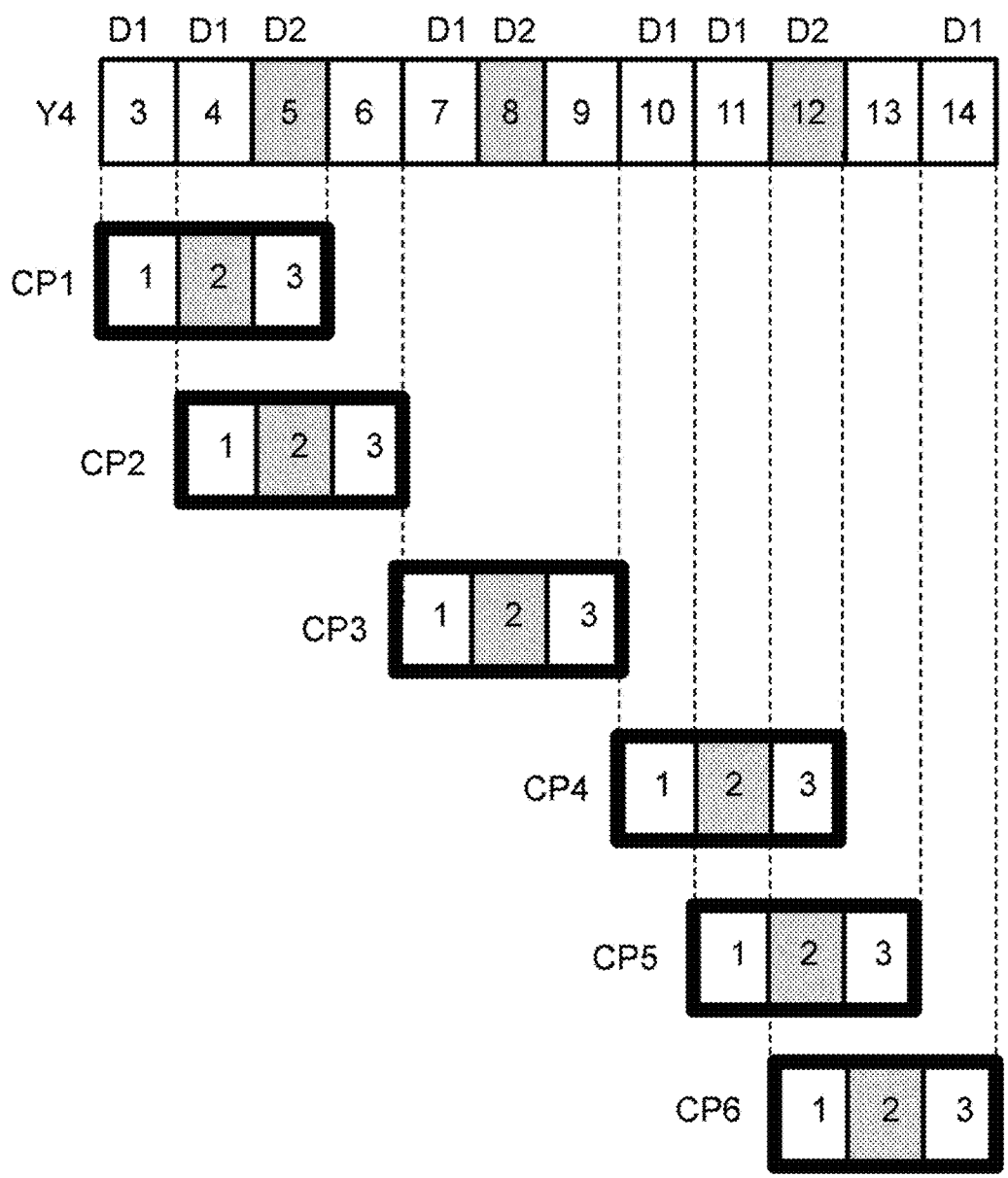
FIG. 25 is a diagram for explaining the determining method of contact positions in the aspect of the third embodiment.

Next, the control unit 201 searches for contact positions of the probe card 205 with respect to devices at positions in a fourth row (Y4) shown in FIG. 25. In searching for each device from the left side, a device at a position of X=3 is a non-defective device D1, so the devices at the positions of X=3 to 5 are set as a first contact position CP1. By doing so, the device at the position of X=4 is a non-defective device D1, but its contact position remains undetermined, so that the devices at the positions of X=4 to 6 are set as a second contact position CP2.

Subsequently, a device at a position of X=7 is a non-defective device D1, so that the devices at the positions of X=7 to 9 are set as a third contact position CP3. Incidentally, the unusable second measurement site 205*b* contacts with the device at the position of X=8, but the device at the position of X=8 is a defective device D2, so that the devices whose contact positions have not been determined do not remain.

Subsequently, a device at a position of X=10 is a non-defective device D1, so that the devices at the positions of X=10 to 12 are set as a fourth contact position CP4. By doing so, the device at the position of X=11 is anon-defective device D1, but its contact position remains undetermined, so that the devices at the positions of X=11 to 13 are set to a fifth contact position CP2.

Subsequently, a device at a position of X=14 is a non-defective device D1, so that the device at the position of X=14 is caused to contact with the first measurement site 205*a*. By doing so, the second measurement site 205*b* and the third measurement site 205*c* become device non-forming regions PA. Therefore, the contact position is returned by two in the left direction so that the third measurement site 205*c* contacts with the device at the position of X=14. The devices at the positions of X=12 to 14 are set as a sixth contact position CP6. By the above operation, the determination of the contact positions of the devices in the fourth line (Y4) is completed. This makes it possible to test all the non-defective devices at the positions in the fourth line (Y4).

Figure 26:
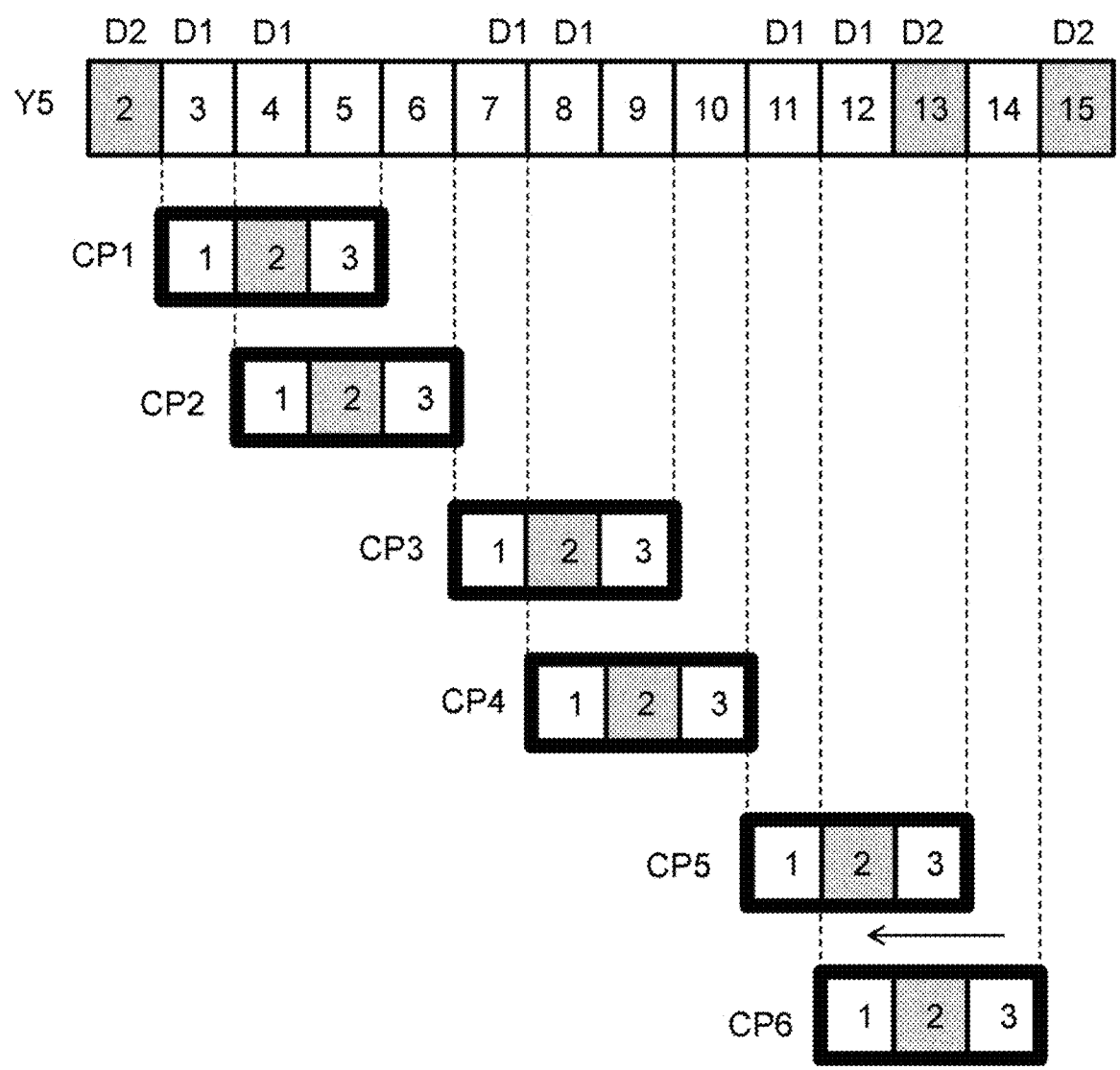
FIG. 26 is a diagram for explaining the determining method of contact positions in the aspect of the third embodiment.

Next, the control unit 201 searches for contact positions of the probe card 205 with respect to devices at positions in a fifth row (Y5) shown in FIG. 26. Each device from the left side is searched for in the same way as described above, devices at positions of X=3 to 5, X=4 to 6, X=7 to 9, X=8 to 10, X=11 to 13, and X=12 to 14 are set as first to sixth contact positions CP1 to CP6, respectively. This makes it possible to test all the non-defective devices at the positions in the fifth line (Y5).

Figure 27:
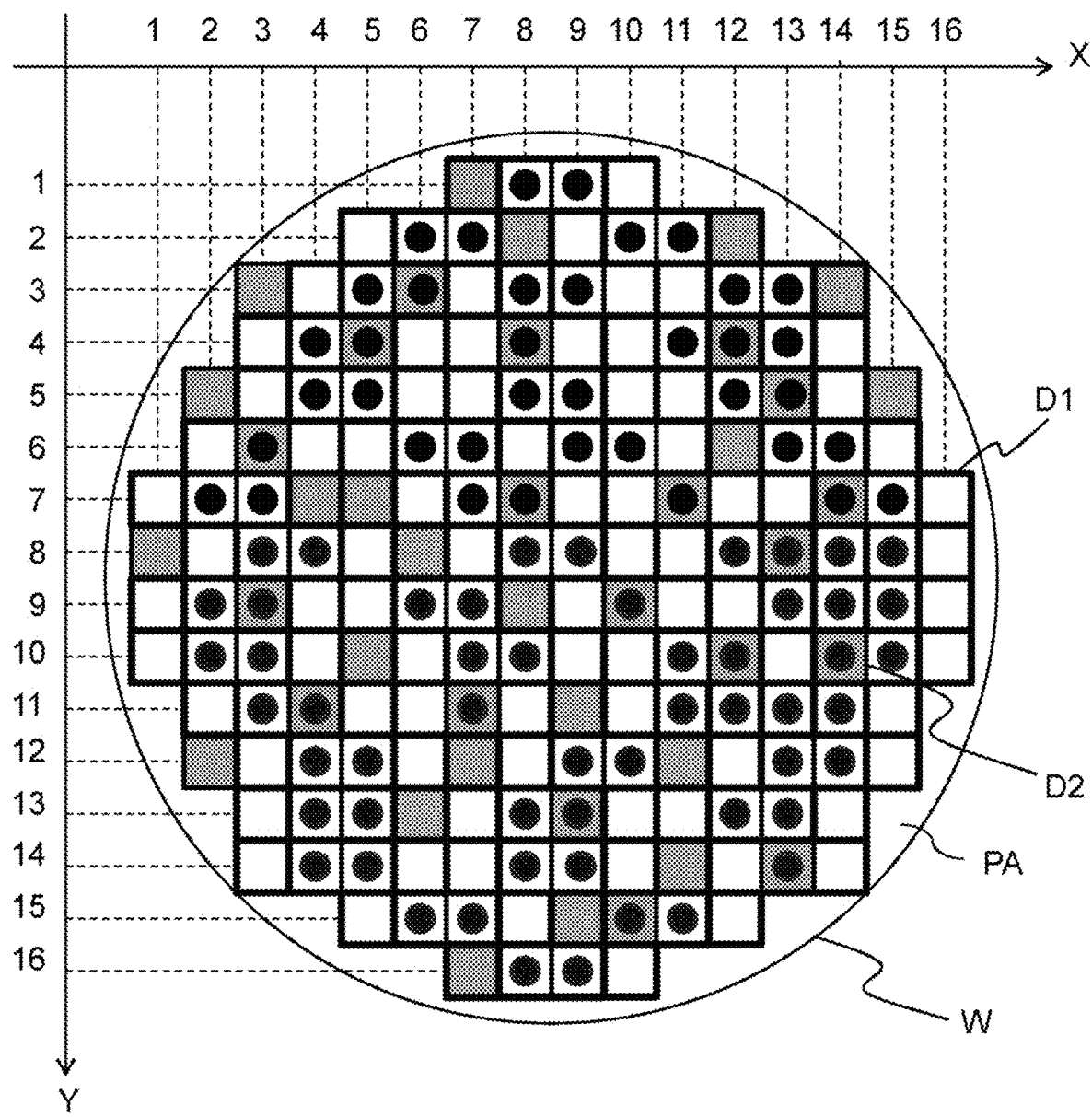
FIG. 27 is a diagram for explaining the determining method of contact positions in the aspect of the third embodiment.

The control unit 201 determines contact positions with respect to devices in a sixth line to a sixteenth line in the same manner as in the above method. The finally determined contact positions are shown in FIG. 27. Rectangular regions of thick black lines in FIG. 27 are contact positions. In order to clarify the contact positions, the position of the second measurement site at each contact position is illustrated by a black circle. Incidentally, in this aspect, an example in which the second measurement site 205*b* is inappropriate for measurement has been described, but the contact operations can be determined similarly to a case where use of the first measurement site 205*a* or the third measurement site 205*c* for measurement is inappropriate.

In the present embodiment, similarly to the first embodiment, the contact positions are determined so that the probe card does not contact with the test non-targeted devices as much as possible. In addition to this, the contact positions of the probe card are determined for each sheet so that only the available (effective) measurement site can contact with all the test targeted devices on the premise that the unusable measurement site(s) of the probe card cannot be used for test. This makes it possible to minimize the number of times of contact of the probe card with the devices on the wafer and reduce the test time required per wafer even if the measurement site(s) of the probe card has any defect.

Fourth Embodiment

Next, a test apparatus according to a fourth embodiment will be described. A configuration of the test apparatus according to the fourth embodiment is the same as the configuration of the test apparatus illustrated in FIG. 5. Further, an operation of the test apparatus according to the fourth embodiment is the same as the operation of the test apparatus shown in FIG. 6.

Next, an operation of making a contact map in the fourth embodiment will be mainly described on parts different from those in the first embodiment by using the flowchart shown in FIG. 7.

(Reading of Map Information: Step S11)

The control unit 201 reads the map information MPI of the devices D formed on the wafer W from the storage unit 203 or the like similarly to that in the first embodiment. The map information MPI includes position information on each device, a test targeted device and a test non-targeted device as peculiar information of each device, and measurement-site information on the probe card used in the previous test.

(Reading of Probe Card Form Information: Step S12)

The control unit 201 reads form information PCI of the probe card 205 from the storage unit 203 or the like similarly to that in the first embodiment.

(Determination of Contact Position: Step S13)

The control unit 201 determines the optimum contact position of the probe card with respect to the devices on the wafer based on the map information MPI and the probe-card form information PCI. In determining the contact positions, the contact position having the minimum number of times of contact per wafer becomes the optimum contact position according to the following constrained conditions.

(1) In each test targeted device, the measurement site(S) of the probe card used in this test being any of a measurement site(S) different from the measurement site(S) of the probe card used in the previous test, the same measurement site(S), or the designated measurement site(s);

(2) Contacting with all the test targeted devices on the wafer as much as possible; and (3) Either prohibiting the probe card from contacting with the device non-forming region PA or allowing it to contact with the device non-forming region PA.

When determining the contact positions, the control unit 201 then determines the contact order to generate the contact map CMP, and the subsequent operations are the same as the operations of steps S14 and S15 of the first embodiment.

Figure 28:
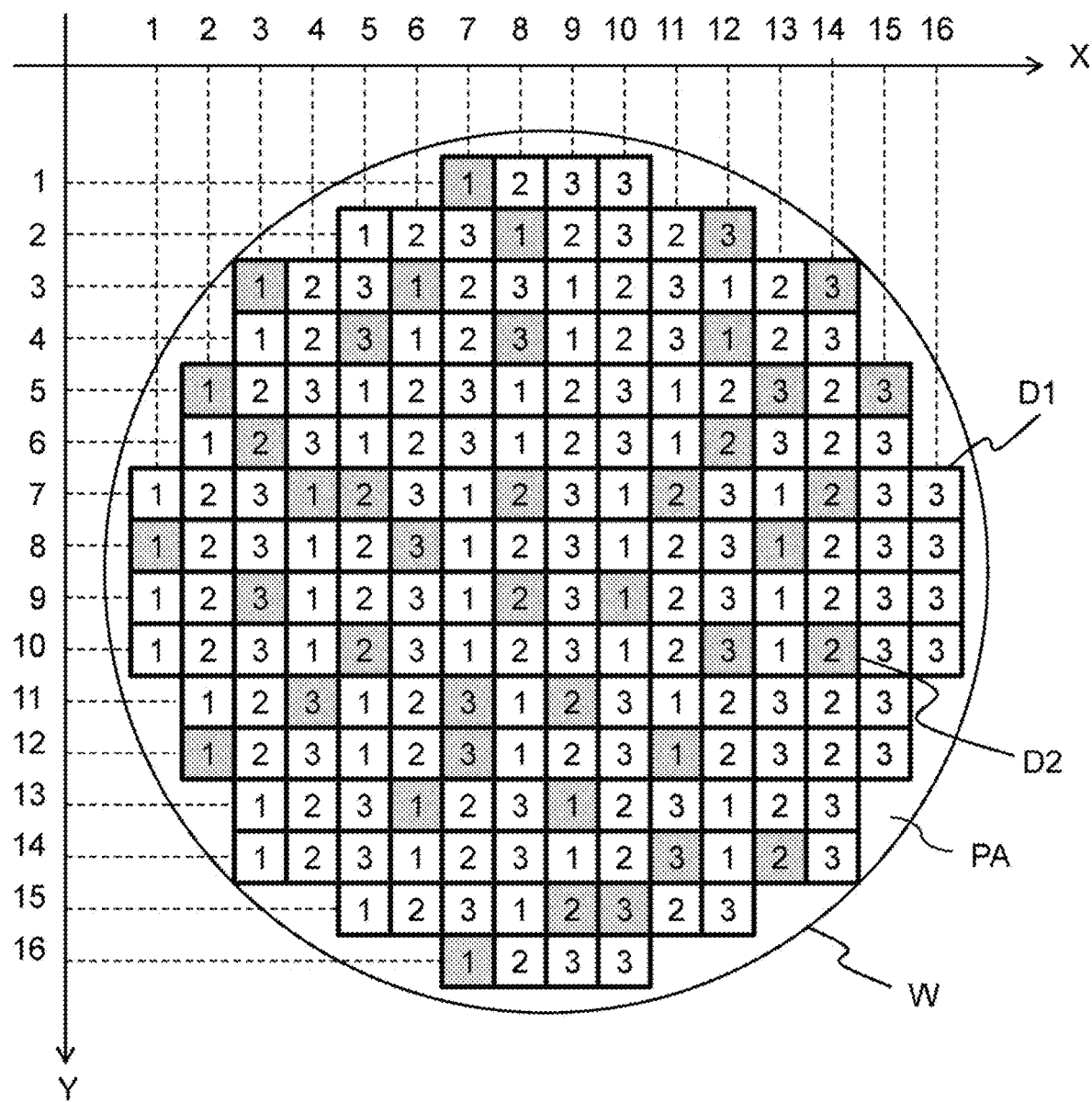
FIG. 28 is a view showing a forming state of devices in an aspect of a fourth embodiment.

Next, an aspect of the fourth embodiment will be described. A precondition(s) in the aspect of the fourth embodiment will be described with reference to FIGS. 2 and 28. FIG. 28 is a view showing a forming state of devices in the aspect of the fourth embodiment.

As shown in FIG. 28, the non-defective devices D1 and the defective devices D2 are formed on the wafer W. A vacant device is a non-defective device D1 and is a test targeted device. A device illustrated in gray is the defective device D2 and is a test non-targeted device. The numerical value written inside each device indicates a measurement site number (MSN) of the probe card 205 that has contacted with and tested the device (s) in the previous test. The measurement site number (MSN) "1" represents the first measurement site 205*a*, "2" represents the second measurement site 205*b*, and "3" represents the third measurement site 205*c*.

In this aspect, the probe card 205 having a first form shown in FIG. 2 is used. However, it is assumed that a constrained condition of being tested at a measurement site(s) different from that in the previous test is given. This is because, for example, when a device measured at a certain measurement site is judged to be defective, there is a possibility that margin properties will be poor due to a minute difference in electrical characteristics between the measurement sites. Therefore, there is a possibility that the device will be measured correctly by being measured again at another measurement site that is expected to have different electrical characteristics and be judged to be a non-defective product, accordingly. Further, also in this aspect, the probe card 205 is prohibited from contacting with the device non-forming region PA.

Under this precondition, the contact positions are determined so that the number of times of contact is minimized at the contact position where the probe card 205 contacts with all the non-defective devices D1 as much as possible and which is tested.

Next, a determining method of contact positions will be described with reference to FIGS. 29 to 34. Each of FIGS. 29 to 34 is a diagram for explaining a method of determining contact positions in the aspect of the fourth embodiment.

Each of FIGS. 29 to 33 is a view showing a forming state of the devices on the wafer shown in FIG. 28 by cutting out them line by line from above the wafer. A numerical value in a rectangle indicating each device is a value written for identifying each device, and is a value in an X axis with respect to the position on the wafer. Further, a numerical value written at a bottom of each device is a measurement site number (MSN) at a time when the probe card has contacted with the above-mentioned devices in the previous test.

In this aspect, the contact positions are determined in principle so that a measurement site different from the previous measurement site contacts with the non-defective device D1 on the leftmost side except for the defective device D2 and the device whose contact position has already been determined. At that time, it is assumed that when a plurality of contact positions is selected as candidates, such measurement sites are selected as to have the largest number of testable measurement sites among other simultaneously contacting measurement sites. Here, the testable measurement site is a measurement site that contacts with the test targeted devices and is different from the contacting measurement site in the previous test. However, if the contact with the device non-forming region PA occurs at any of the contact positions, the contact with the above-mentioned device is considered impossible and the above-mentioned device is judged to be defect.

Figure 29:
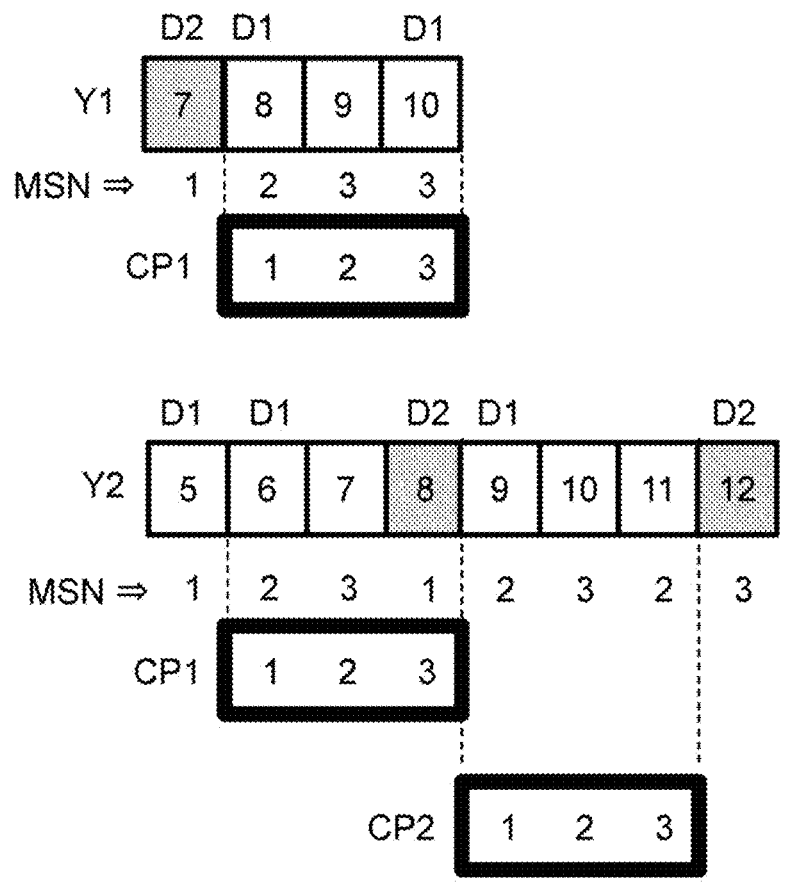

First, the control unit 201 determines contact positions of the probe card 205 with respect to devices at positions in a first row (Y1) shown in FIG. 29. In searching for each device from the left side, a device at a position of X=7 is a defective device D2 and so is excluded. A device at a position of X=8 next thereto is a non-defective device D1. In the previous test, the second measurement site 205*b* has contacted with the above-mentioned device. Therefore, in this test, a contact position is determined so that a measurement site(s) other than the second measurement site 205*b* contacts with the above-mentioned device. That is, the devices at the positions of X=8 to 10 are set as a first contact position CP1 so that the first measurement site 205*a* contacts with the device at the position of X=8. In such a case, no problem arises because the second measurement site 205*b* contacts with the device at the position of X=9 and is different from the third measurement site 205*c* used in the previous test. However, when the third measurement site 205*c* contacts with the device at the position of X=10, it becomes the same measurement site as the third measurement site 205*c* used in the previous test, so that the test is not performed to the above-mentioned device.

Next, since the device at the position of X=10 is a non-defective device D1, a contact position with respect to the above-mentioned device is determined. In the previous test, the third measurement site 205*c* contacts with the device, so that in this test, the first measurement site 205*a* or the second measurement site 205*b* needs to contact with the above-mentioned device. However, when the first measurement site 205*a* or the second measurement site 205*b* is caused to contact with the above-mentioned device, the third measurement site 205*c* inevitably contacts with the device non-forming region PA, which violates the constrained condition, so that the optimum contact position cannot be determined. Therefore, the device at the position of X=10 is regarded as untestable, and the determination of the contact position is stopped. Incidentally, When the contact with the device non-forming region PA is allowed under the constrained condition, the first measurement site 205*a* leads to contacting with the above-mentioned device.

Next, the control unit 201 determines contact positions of the probe card 205 with respect to devices at positions in a second row (Y2) shown in FIG. 29. In searching for each device from the left side, a device at a position of X=5 is a non-defective device D1. Since the first measurement site 205*a* contacts with the above-mentioned device in the previous test, the second measurement site 205*b* or the third measurement site 205*c* needs to contact with the above-mentioned device in this test. However, in such a case, the first measurement site 205*a* contacts with the device non-forming region PA, which violates the constrained condition accordingly. Therefore, it is impossible to cause the measurement site of the designated probe card 205 to contact with the device at the position of X=5, and the above-mentioned device is untestable.

A device at a position of X=6 subsequently thereto is a non-defective device D1. Since the second measurement site 205*b* contacts with the above-mentioned device in the previous test, the first measurement site 205*a* or the third measurement site 205*c* is caused to contact with the above-mentioned device in this test. If an attempt is made to cause the third measurement site 205*c* to contact with the above-mentioned device, the first measurement site 205*a* leads to contacting with the device non-forming region PA, so that the devices at the positions of X=6 to 8 are set as a first contact position CP1. Consequently, the device at the position of X=6 leads to contacting with the first measurement site 205*a*, and the device at the position of X=7 leads to contacting with the second measurement site 205*b*. Incidentally, the device at the position of X=8 is a defective device D2, but contacts with the third measurement site 205*c*.

A device at a position of X=9 subsequently thereto is the non-defective device D1. Since the second measurement site 205*b* contacts with the above-mentioned device and is used in the previous test, the first measurement site 205*a* or the third measurement site 205*c* needs to contact with the above-mentioned device in this test. Therefore, the devices at the positions of X=9 to 11 are set as a contact position so that the above-mentioned device contacts with the first measurement site 205*a*. Consequently, the device at the position of X=10 contacts with the third measurement site 205*c* in the previous test, but contacts with the second measurement site 205*b* in this test. A device at a position X=11 contacts with the second measurement site 205*b* in the previous test, but contacts with the third measurement site 205*c* in this test. The positions of X=9 to 11 are appropriate to a contact position since the measurement site used in this test is different from the measurement site used in the previous test, so that they are set as a second contact position CP2. In this way, determined are the contact positions of the probe card with respect to the devices at the positions in the second line (Y2).

Figure 30:
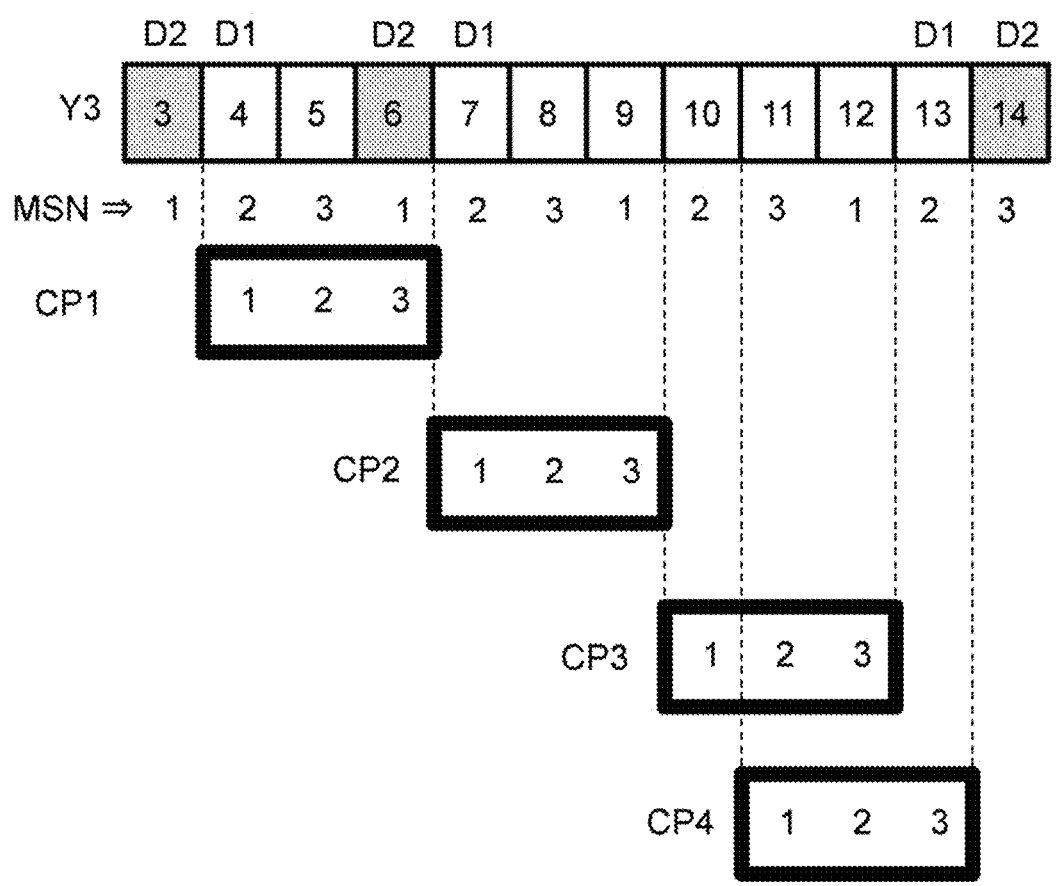
FIG. 30 is a diagram for explaining the determining method of contact positions in the aspect of the fourth embodiment.

Next, the control unit 201 determines contact positions of the probe card 205 with respect to devices at positions in a third row (Y3) shown in FIG. 30. In searching for each device from the left side, a device at a position of X=3 is a defective device D2 and so is excluded. A device at a position of X=4 next thereto is a non-defective device D1. Since the second measurement site 205b contacts with the above-mentioned device in the previous test, the first measurement site 205a or the third measurement site 205c needs to contact with the above-mentioned device in this test. When the third measurement site 205c contacts with the above-mentioned device, the first measurement site 205a departs from the device non-forming region PA. Therefore, the devices at the positions of X=4 to 6 are set as a contact position so that the first measurement site 205a is caused to contact with the above-mentioned device. By doing so, the device at the position of X=4 contacts with the second measurement site 205b in the previous test, but leads to contacting with the first measurement site 205a in this test. The device at the position of X=5 has contacted with the third measurement site 205c in the previous test, but leads to contacting with the second measurement site 205b in this test. Since the positions of X=4 to 6 are appropriate to contact positions, they are set as a first contact position CP1.

A device at a position of X=7 subsequently thereto is a non-defective device D1. Since the second measurement site 205b has contacted with the above-mentioned device in the previous test, the first measurement site 205a or the third measurement site 205c needs to contact with the above-mentioned device in this test. Since causing the first measurement site 205a to contact with the above-mentioned devices can bring new contact with a non-contacting non-defective device(s), the devices at the positions of X=7 to 9 are set as a contact position. By doing so, the first measurement site 205a contacts with the device at the position of X=7, the second measurement site 205b contacts with the device at the position of X=8, and the third measurement site 205a contacts with the device at the position of X=9. All of these contact positions satisfy with the constrained condition since the measurement site(s) used in this test is different from that used in the previous test. Accordingly, the positions of X=7 to 9 are set as a second contact position CP2.

Similarly, it is assumed that a third contact position CP3 is set as devices located at positions of X=10 to 12. By doing so, the first measurement site 205a leads to contacting with a device at a position of X=10, the second measurement site 205b leads to contacting with a device at a position of X=11, and the third measurement site 205c leads to contacting with a device at a position of X=12. These contact positions are appropriate because a measurement site different from the measurement site used in the previous test contacts with any of the above-mentioned device.

A device at a position of X=13 subsequently thereto is a non-defective device D1. In the previous test, the second measurement site 205b has contacted with the above-mentioned device. Therefore, in this test, the first measurement site 205a or the third measurement site 205c needs to contact with the above-mentioned device. If an attempt is made to cause the first measurement site 205a to contact with the above-mentioned device, the third measurement site 205c contacts with the device non-forming region PA, which is inappropriate as a contact position. Therefore, the contact position is determined so that the third measurement site 205c contacts with the above-mentioned device. By doing so, the remaining first measurement site 205a and second measurement site 205b contact with devices at positions of X=11 and 12, so that such devices are appropriate as contact positions. A fourth contact position CP4 with respect to the devices in the third line is set as the devices at the positions of X=11 to 13.

Figure 31:
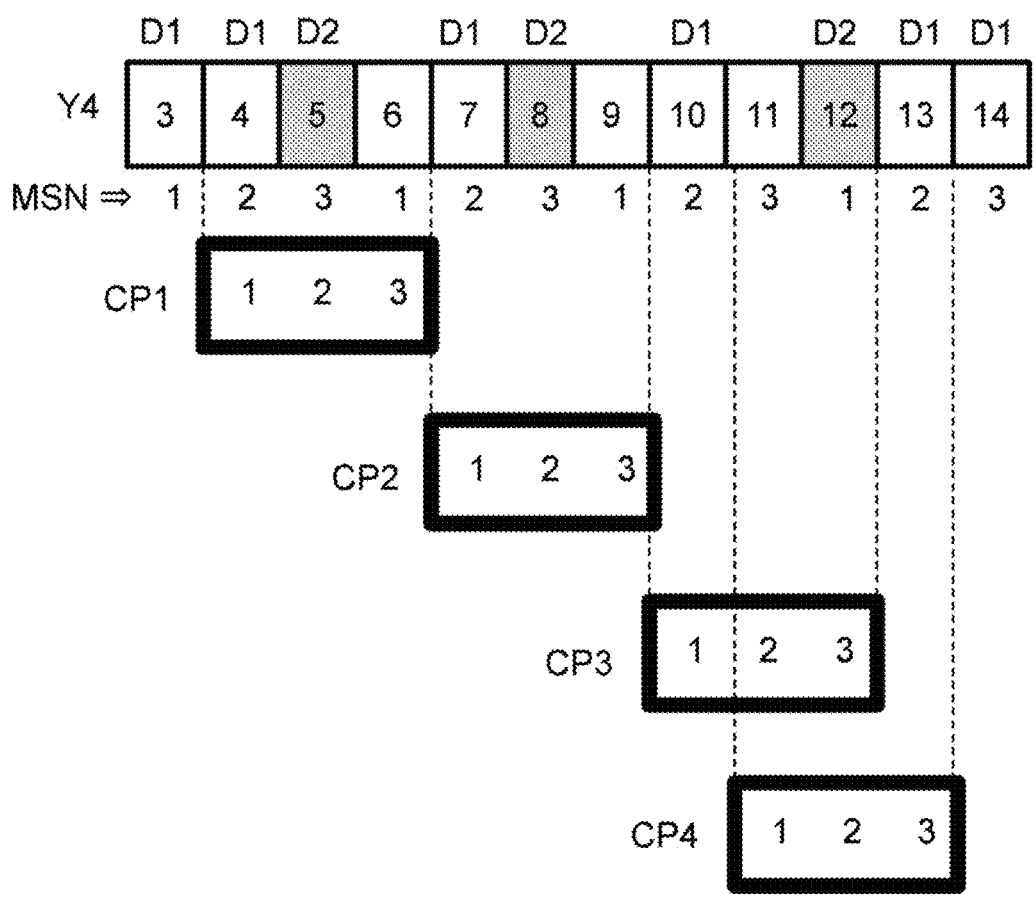
FIG. 31 is a diagram for explaining the determining method of contact positions in the aspect of the fourth embodiment.

Next, the control unit 201 determines contact positions of the probe card 205 with respect to devices at positions in a fourth row (Y4) shown in FIG. 31. In searching for each device from the left side, a device at a position of X=3 is a non-defective device D1. Since the first measurement site 205a contacts with the above-mentioned device in the previous test, the second measurement site 205b or the third measurement site 205c needs to contact with the above-mentioned device in this test. In either case, the first measurement site 205a leads to contacting with the device non-forming region PA, which is inappropriate as a contact position, and the probe card cannot contact with the device at the position of X=3, so that the above-mentioned device becomes untestable.

A device at a position of X=4 subsequently thereto is a non-defective device D1. Since the second measurement site 205b contacts with the above-mentioned device in the previous test, the first measurement site 205a or the third measurement site 205c needs to contact with the above-mentioned device in this test. However, if the third measurement site 205c is caused to contact with the above-mentioned device, the first measurement site 205a leads to contacting with the device non-forming region PA, which is inappropriate. Therefore, the devices at the positions of X=4 to 6 are set as a first measurement site 205a so that the first measurement site 205a contacts with the above-mentioned device. In this case, all of the measurement sites also contact with the above-mentioned device, which is appropriate as contact positions. Furthermore, the device at the position of X=6 has contacted with the first measurement site 205a in the previous test, but leads to contacting with the third measurement site 205c in this test.

A device at a position of X=7 subsequently thereto is a non-defective device D1. Since the second measurement site 205b has contacted with the above-mentioned device in the previous test, this test is performed so that the first measurement site 205a contacts with the above-mentioned device. That is, the devices at the positions of X=7 to 9 are set as a second contact position CP2. Consequently, the device at the position of X=9 is also caused to contact therewith appropriately.

A device at a position of X=10 subsequently thereto is a non-defective device D1. Since the second measurement site 205b has contacted with the above-mentioned device in the previous test, this test is performed so that the first measurement site 205a contacts with the above-mentioned device. That is, the devices at the positions of X=10 to 12 are set as a third contact position CP3. Consequently, the device at the position of X=11 also leads to contacting therewith appropriately.

A device at a position of X=13 subsequently thereto is a non-defective device D1. Since the second measurement site 205b has contacted with the above-mentioned device in the previous test, the first measurement site 205a or the third measurement site 205c needs to contact with the above-mentioned device in this test. However, when the first measurement site 205a contacts with the above-mentioned device, the third measurement site 205c departs from the device non-forming region PA, which is inappropriate. Therefore, a fourth contact position CP4 is set as the devices at the positions of X=11 to 13 so that the third measurement site 205c contacts with the above-mentioned device.

A device at a position of X=14 subsequently thereto is a non-defective device D1. However, an appropriate contact position cannot be determined with respect to the above-mentioned device, so that the above-mentioned device becomes untestable. By the above operation, the contact positions of the probe card with respect to the above-mentioned devices in the fourth line can be determined.

Figure 32:
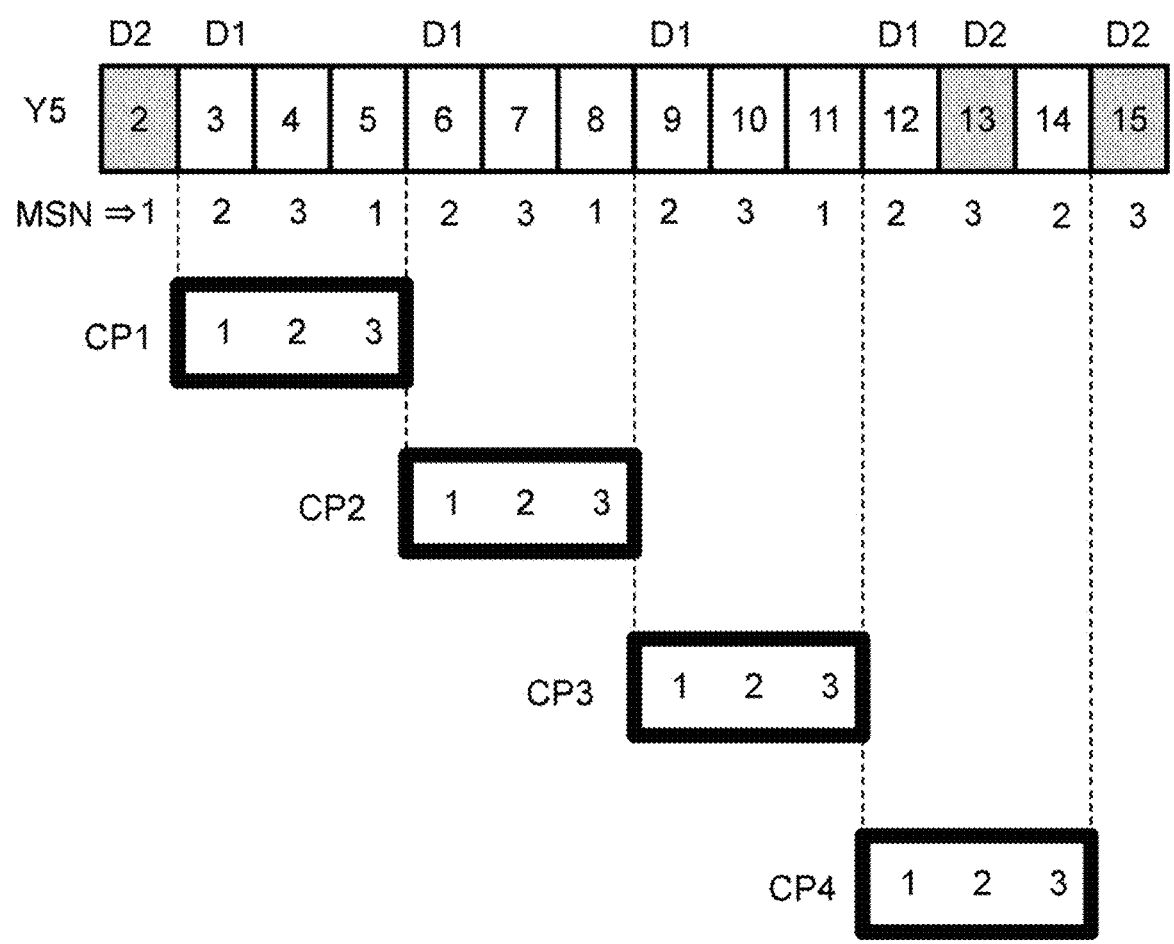
FIG. 32 is a diagram for explaining the determining method of contact positions in the aspect of the fourth embodiment.

Next, the control unit 201 determines contact positions of the probe card 205 with respect to devices at positions in a fifth row (Y5) shown in FIG. 32. In searching for each device from the left side, a device at a position of X=2 is a defective device D2, and so is excluded. A device at a position of X=3 next thereto is a non-defective device D1. In the previous test, the second measurement site 205b has contacted with the above-mentioned device, so that in this test, the first contact position CP1 is defined as the devices at the positions of X=3 to 5 so as for the first measurement site 205a to contact with the above-mentioned device. Consequently, the appropriate contact with devices at positions of X=4 and 5 can also be obtained.

Similarly, a second contact position CP2 and a third contact position CP3 are defined as devices at positions of X=6 to 8 and X=9 to 10, respectively. Consequently, the contact with the six devices at the positions X=6 to 11 leads to being appropriately made.

A device at a position of X=12 subsequently thereto is a non-defective device D1. In the previous test, the second measurement site 205b has contacted with the above-mentioned device, so that in this test, a contact position is defined as the devices at the positions of X=12 to 14 so as for the first measurement site 205a to contact with the above-mentioned device. This contact position causes the device at the position X=14 to contact with the third measurement site 205c, which is appropriate contact, so that such a contact position is determined as a fourth measurement site 205c. By the above operations, the determination of the contact position of the probe card with respect to the devices in the fifth line is completed.

Figure 33:
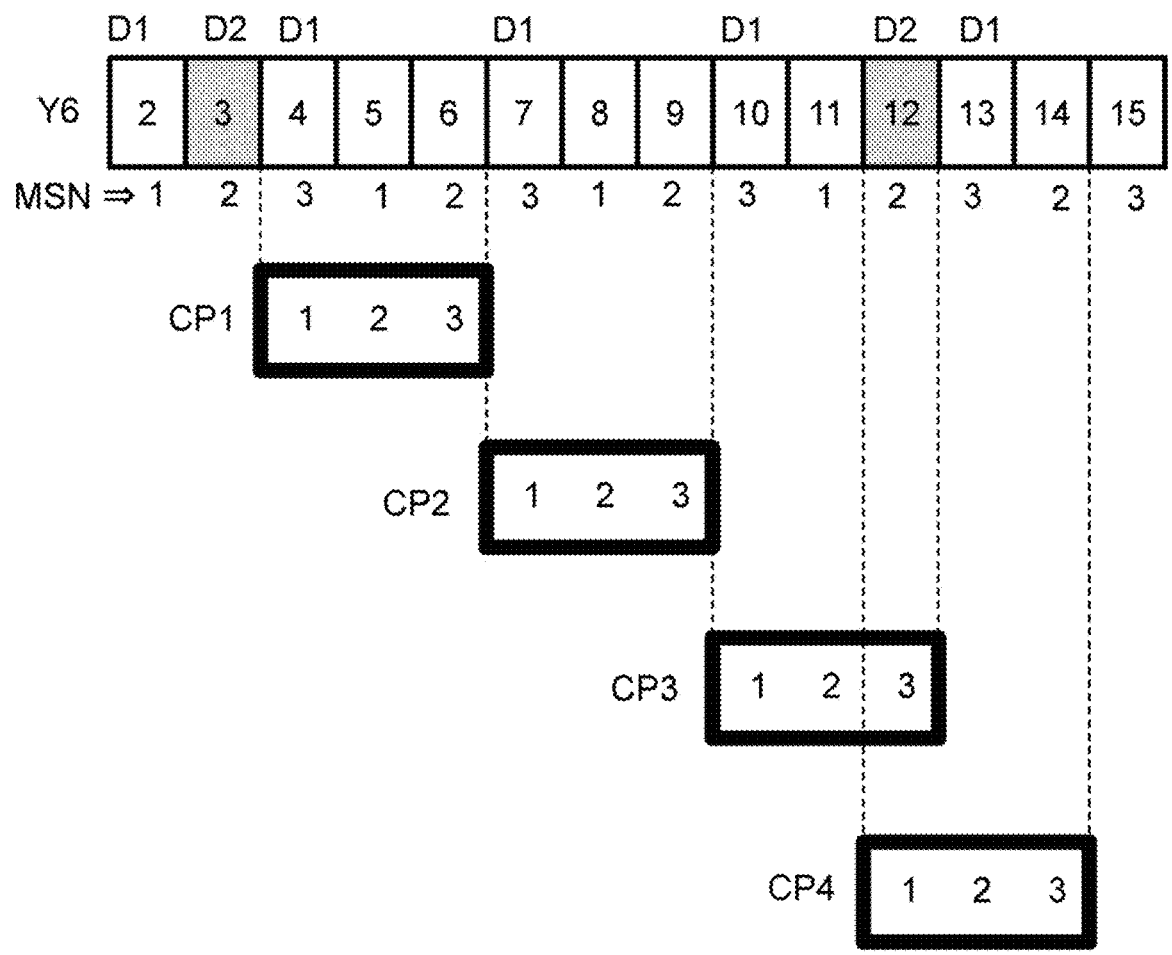
FIG. 33 is a diagram for explaining the determining method of contact positions in the aspect of the fourth embodiment.

Next, the control unit 201 determines contact positions of the probe card 205 with respect to devices at positions in a sixth row (Y6) shown in FIG. 33. In searching for each device from the left side, a device at a position of X=2 is a non-defective device D1. However, obtaining the appropriate contact with the above-mentioned device is impossible, and testing of the above-mentioned device is impossible. A device at a position of X=3 subsequently thereto is a defective device D2, and so is excluded.

A device at a position of X=4 subsequently thereto is a non-defective device D1. Since the third measurement site 205c has contacted with the above-mentioned device in the previous test, one contact position CP1 is defined as the devices at the positions of X=4 to 6 in this test. Consequently, the three devices at the positions of X=4 to 6 lead to being tested at a measurement site (s) different from the measurement site used in the previous test, which becomes an appropriate contact position.

Similarly, when a second contact position CP2 is defined as devices at positions of X=7 to 9 and a third contact position CP3 is defined as devices at positions of X=10 to 12, any of the above-mentioned devices becomes an appropriate contact position(s).

A device at a position of X=13 subsequently thereto is a non-defective device D1. Since the third measurement site 205c has contacted with the above-mentioned device in the previous test, the first measurement site 205a or the second measurement site 205b needs to contact with the above-mentioned device in this test. A contact position is set as the devices at the positions of X=13 to 15 so that the first measurement site 205a contacts with the above-mentioned device. By doing so, the second measurement site 205b leads to contacting with the device at the position of X=14, and the third measurement site 205c leads to contacting with the device at the position of X=15. This contact position is inappropriate because matching with the measurement site in the previous test. Therefore, by setting a contact position as the devices at the positions of X=12 to 14, the second measurement site 205b contacts with the device at the position of X=13, and the third measurement site 205c contacts with the device at the position of X=14. In this case, since all of them are an appropriate contact, the devices at the positions of X=12 to 14 are set as a fourth contact position.

A device at a position of X=15 subsequently thereto is a non-defective device D1. Since the third measurement site 205c has contacted with the above-mentioned device in the previous test, causing a measurement site(s) other than the third measurement site 205c to contact with the above-mentioned device in this test is impossible. Therefore, the contact positions with respect to the above-mentioned device cannot be determined. By the above operations, the contact positions of the probe card with respect to the semiconductor device in the sixth line is determined.

Figure 34:
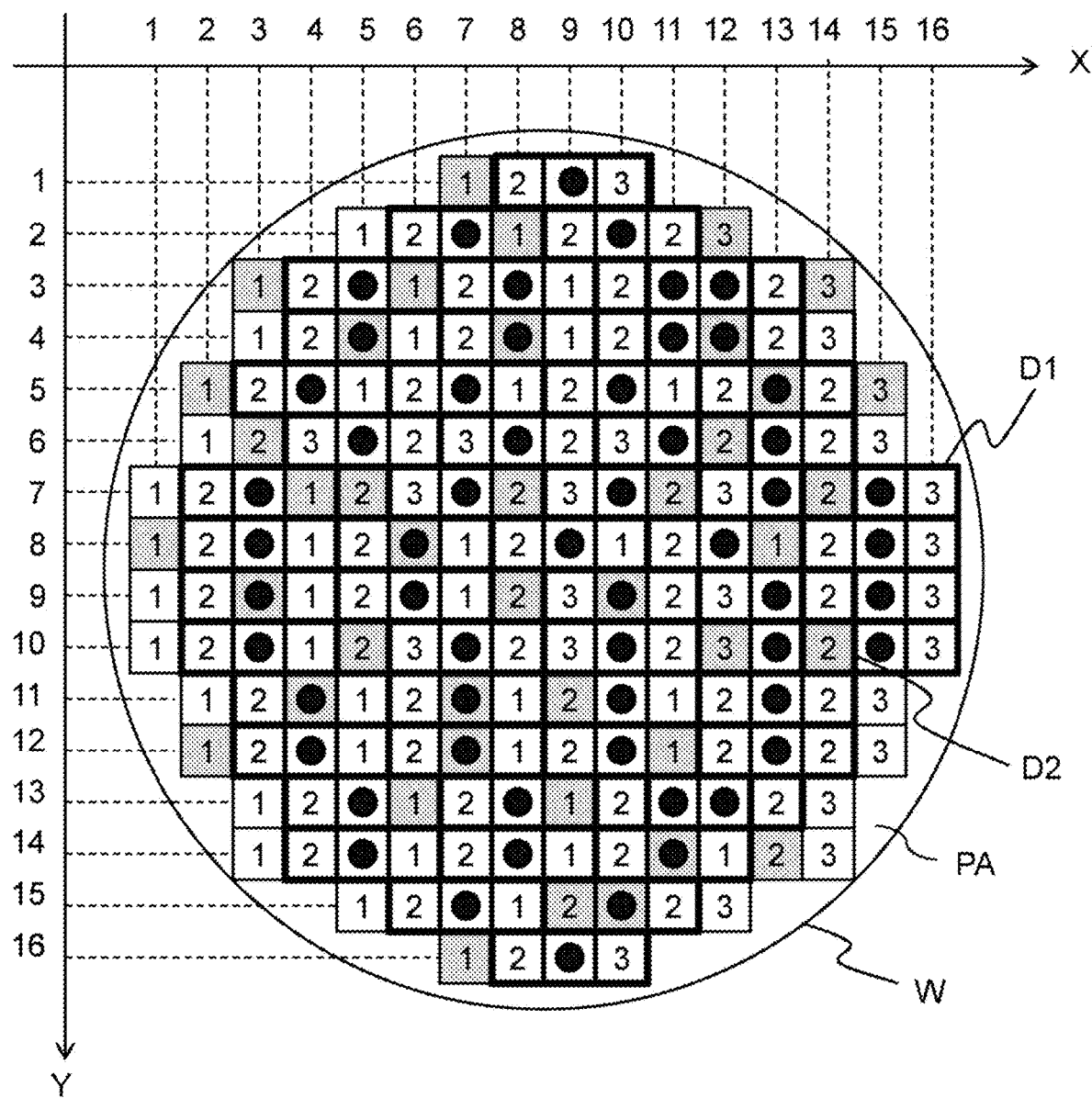
FIG. 34 is a diagram for explaining the determining method of contact positions in the aspect of the fourth embodiment.

The control unit 201 determines contact positions of the probe card with respect to devices at positions in a seventh and subsequent lines in the same manner as the above method. The finally determined contact positions of the probe card are illustrated in FIG. 34. Rectangular regions of thick black lines in FIG. 34 are the contact positions. In order to clarify the contact positions, the position of the second measurement site at each contact position is indicated by a black circle.

In the present embodiment, the measurement site of the probe card is changed to the measurement site used at the time of the previous test. If any defects or slight deviations in the characteristics occur at the measurement site of the probe card, the device may be judged to be defective due to minute fluctuations in measured values. By exchanging the measurement site of the probe card for such a device and executing the test again, the device that has once been determined to be defective may be remedied as a non-defective product. This makes it possible to correctly improve the devices and to improve test quality.

The disclosure made by the present discloser has been specifically described above based on the embodiments, but the present disclosure is not limited to the above embodiments and, needless to say, can variously be changed.

For example, in the embodiment, the example in which the contact map is generated by the control unit 201 has been described, but the contact map may be generated by the CPU executing a program in an apparatus separately provided in the prober 200.

Further, the contact map may be generated by the CPU in the tester 100 executing the program, or the contact map may be generated by a CPU of a higher-level apparatus of the tester 100 executing the program.

Furthermore, in the embodiment, an example in which the probe card 205 has three measurement sites 205a to 205c or six measurement sites 205a to 205f has been described, but the prove card may have two, four, five, or seven or more measurement sites.

What is claimed is:

1. A test apparatus comprising:
a probe card having a plurality of measurement sites contacting with a plurality of semiconductor devices formed on a semiconductor wafer;
a control unit configured to generate map information, probe-card form information, and contact-position information, the map information including position information and peculiar information of the semiconductor devices in the semiconductor wafer, the probe-card form information including arrangement information of the measurement sites, the contact-position information indicating a contact position which is a range of testing the semiconductor devices at one time by the probe card based on constrained-condition information of limiting contact with the probe card; and
a position control unit configured to control a relative distance between the probe card and the semiconductor wafer based on the contact position.

2. The test apparatus according to claim 1,
wherein the control unit is configured to generate contact-order information and generate a contact map, the contact-order information indicating which order the probe card contacts with the semiconductor devices on the semiconductor wafer in, the contact map including the contact-position information and the contact-order information, and
wherein the position control unit is configured to control the relative distance between the probe card and the semiconductor wafer based on the contact map.

3. The test apparatus according to claim 1,
wherein the peculiar information is information on whether each of the semiconductor devices is a test targeted device or a test non-targeted device, and
wherein the constrained-condition information is information on whether contact is allowed in a device non-forming region of not forming each of the semiconductor devices on the semiconductor wafer.

4. The test apparatus according to claim 3,
wherein the peculiar information further includes information on a contact prohibited device that the probe card is prohibited from contacting with.

5. The test apparatus according to claim 3,
wherein the probe-card form information further includes information on which measurement site of the plurality of measurement sites is unusable.

6. The test apparatus according to claim 3,
wherein the peculiar information further includes information on which measurement site of the probe card contacts with each of the semiconductor devices in a previous test.

7. The test apparatus according to claim 3,
wherein the plurality of measurement sites is arranged on the probe card in line along a first direction, a measurement site arranged on one end side of the probe card being set as a one-end-side measurement site, a measurement site arranged on the other end side thereof being set as an other-end-side measurement site, and
wherein the control unit is configured to:
search for the semiconductor devices along the first direction from one end side of the semiconductor wafer to the other end side thereof, and set a provisional contact position so that the one-end-side measurement site contacts with a first test targeted device;
determine the provisional contact position as a contact position when the other-end-side measurement site and a measurement site between the one-end-side measurement site and the other-end-side measurement site are not located in the device non-forming region; and
determine, as a contact position, a position where the other-end-side measurement site is returned to a region in which the semiconductor devices are formed on the semiconductor wafer when the other-end-site measurement site and the measurement site between the one-end-site measurement site and the other-end-side measurement site are located in the device non-forming region.

8. The test apparatus according to claim 4,
wherein the plurality of measurement sites is arranged on the probe card in line along a first direction, a measurement site arranged on one end side of the probe card being set as a one-end-side measurement site, the measurement site arranged on the other end side thereof being set as an other-end-side measurement site, and
wherein the control unit is configured to:
search for the semiconductor devices along the first direction from the one end side of the semiconductor wafer, and determine a provisional contact position so as to cause the one-end-side measurement site to contact with the first test targeted device;
determine the provisional contact position as a contact position when the other-end-side measurement site and a measurement site between the one-end-side measurement site and the other-end-side measurement site are not located in the contact prohibited region and the device non-forming region;
determine, as a provisional contact position, a position of returning the other-end-side measurement site to a semiconductor device other than the contact prohibited device and to a region where the semiconductor devices are formed on the semiconductor wafer when the other-end-side measurement site and the measurement site between the one-end-side measurement site and the other-end-side measurement site are located at the contact prohibited device or in the device non-forming region;
determine the provisional measurement site as a contact position when the one-end-side measurement site and a measurement site between the one-end-side measurement site and the other-end-side measurement site are not located at the contact prohibited device and in the device non-forming region; and
be considered as contact impossible when the one-end-side measurement site and the measurement site between the one-end-side measurement site and the other-end-side measurement site are located at the contact prohibited device and in the device non-forming region.

9. The test apparatus according to claim 3,
wherein the plurality of measurement sites is arranged on the probe card in a plurality of rows and a plurality of columns.

10. The test apparatus according to claim 1, further comprising a tester supplying a power source and a test signal via the probe card to the semiconductor devices.

11. A test method using a probe card that has a plurality of measurement sites contacting with a plurality of semiconductor devices formed on a semiconductor wafer, the test method comprising:
generating map information, probe-card form information, and contact-position information, the map information including position information and peculiar information of the semiconductor devices on the semiconductor wafer, the probe-card form information including arrangement information of the measurement sites, the contact-position information indicating a contact position that is a range of the semiconductor devices tested at one time by the probe card based on constrained-condition information for limiting contact with the probe card;

generating contact-order information indicating which order the probe card contacts with the semiconductor devices on the semiconductor wafer in;

generating a contact map including the contact-position information and the contact-order information; and controlling a relative position between the probe card and each of the semiconductor devices based on the contact map.

12. A recording medium comprising:

being readable by a test apparatus provided with a probe card that has a plurality of measurement sites contacting with a plurality of semiconductor devices formed on a semiconductor wafer, generating map information, probe-card form information, contact-position information, the map information including position information and peculiar information of the semiconductor devices on the semiconductor wafer, the probe-card form information including arrangement information of the measurement sites, the contact-position information indicating a contact position that is a range of the semiconductor devices tested at one time by the probe card based on constrained-condition information of limiting contact with the probe card;

generating contact-order information indicating which order the probe card contacts with the semiconductor devices on the semiconductor wafer in;

generating a contact map including the contact-position information and the contact-order information; and storing a program for controlling a relative position between the probe card and the semiconductor wafer based on the contact map.

\* \* \* \* \*